US008125777B1

(12) United States Patent
MacLennan et al.

(10) Patent No.: US 8,125,777 B1
(45) Date of Patent: Feb. 28, 2012

(54) METHODS AND APPARATUS FOR ELECTRICAL COMPONENTS

(75) Inventors: Grant MacLennan, Scottsdale, AZ (US); Benjamin Richie, Scottsdale, AZ (US)

(73) Assignee: CTM Magnetics, Inc., Tempe, AZ (US)

( * ) Notice: Subject to any disclaimer, the term of this patent is extended or adjusted under 35 U.S.C. 154(b) by 260 days.

(21) Appl. No.: 12/497,272

(22) Filed: Jul. 2, 2009

Related U.S. Application Data

(60) Provisional application No. 61/078,304, filed on Jul. 3, 2008.

(51) Int. Cl.
*H05K 7/20* (2006.01)

(52) U.S. Cl. ........ 361/689; 361/676; 361/698; 361/699; 361/707; 310/208; 336/229

(58) Field of Classification Search .................. 361/600, 361/613, 637, 647, 648, 676, 677, 688.689, 361/697, 698, 699, 707
See application file for complete search history.

(56) References Cited

U.S. PATENT DOCUMENTS

| | | | | |
|---|---|---|---|---|
| 3,374,452 | A * | 3/1968 | Judd | 336/60 |
| 3,377,582 | A | 4/1968 | Rogers | |
| 3,668,589 | A | 6/1972 | Wilkinson | |
| 4,393,435 | A | 7/1983 | Petrina | |
| 4,547,713 | A | 10/1985 | Langley et al. | |
| 4,639,626 | A * | 1/1987 | McGee | 310/155 |
| 4,710,667 | A | 12/1987 | Whiteley | |
| 4,806,895 | A | 2/1989 | Petrow | |
| 4,980,794 | A * | 12/1990 | Engel | 361/187 |
| 5,256,211 | A | 10/1993 | Silgailis et al. | |
| 5,307,043 | A | 4/1994 | Dvorak et al. | |
| 5,444,229 | A | 8/1995 | Rudolph et al. | |
| 5,481,238 | A | 1/1996 | Carsten et al. | |
| 5,543,674 | A | 8/1996 | Koehler | |
| 5,543,773 | A * | 8/1996 | Evans et al. | 336/183 |
| 5,868,123 | A | 2/1999 | Hasegawa et al. | |
| 6,154,109 | A * | 11/2000 | Gold | 335/299 |
| 6,166,472 | A * | 12/2000 | Pinkerton et al. | 310/208 |
| 6,262,651 | B1 | 7/2001 | Miyamoto et al. | |
| 6,648,990 | B2 | 11/2003 | Yoshizawa | |
| 6,690,257 | B2 | 2/2004 | Kobayashi et al. | |
| 6,897,718 | B2 | 5/2005 | Yoshida et al. | |
| 7,352,270 | B1 * | 4/2008 | Copeland | 336/200 |
| 7,471,181 | B1 * | 12/2008 | MacLennan | 336/229 |
| 7,479,865 | B2 | 1/2009 | Feist et al. | |
| 7,498,916 | B2 | 3/2009 | Feist et al. | |
| 7,855,629 | B2 | 12/2010 | MacLennan | |
| 2007/0000648 | A1 * | 1/2007 | Crocker et al. | 165/104.33 |
| 2009/0021096 | A1 * | 1/2009 | Tatematsu et al. | 310/156.38 |
| 2009/0045898 | A1 | 2/2009 | MacLennan | |
| 2009/0267720 | A1 | 10/2009 | Maclennan et al. | |

FOREIGN PATENT DOCUMENTS

| | | | |
|---|---|---|---|
| DE | 3047603 | A | 7/1982 |

* cited by examiner

*Primary Examiner* — Courtney Smith
(74) *Attorney, Agent, or Firm* — The Noblitt Group, PLLC

(57) ABSTRACT

Methods and apparatus for electrical components according to various aspects of the present invention may be implemented in conjunction with an electrical system comprising a heat generating component and a cooling system. The cooling system may comprise a cooling channel and a coolant. The coolant is disposed within the cooling channel and in thermal contact with the heat generating component.

17 Claims, 20 Drawing Sheets

METHODS AND APPARATUS FOR ELECTRICAL COMPONENTS

CROSS-REFERENCE TO RELATED APPLICATION

This application claims the benefit of U.S. Provisional Patent Application No. 61/078,304, filed Jul. 3, 2008 entitled METHODS AND APPARATUS FOR ELECTROMAGNETIC COMPONENTS.

BACKGROUND

Electromagnetic components are used in a variety of applications. In many industrial applications, electromagnetic components, such as inductors, are integral components in a wide array of machines. For example, high current inductors are widely used in filtering undesirable components from high power electrical signals. Conventional silicon iron steel inductors have limits on inductance as a function of specified cost, space, and weight. Conventional structures have been used in high current environments and applications, but prior efforts to meet power and saturation requirements have resulting in large components, high operating temperatures, and excessive electromagnetic emissions.

SUMMARY

Methods and apparatus for electrical components according to various aspects of the present invention may be implemented in conjunction with an electrical system comprising a heat generating component and a cooling system. The cooling system may comprise a cooling channel and a coolant. The coolant is disposed within the cooling channel and in thermal contact with the heat generating component.

BRIEF DESCRIPTION OF THE DRAWING FIGURES

A more complete understanding of the present invention may be derived by referring to the detailed description and claims considered in connection with the illustrative figures. In the figures, like reference numbers refer to similar elements and steps.

FIGS. 1A-B are schematic diagrams of an electrical system according to various aspects of the present invention;

Figure 10:
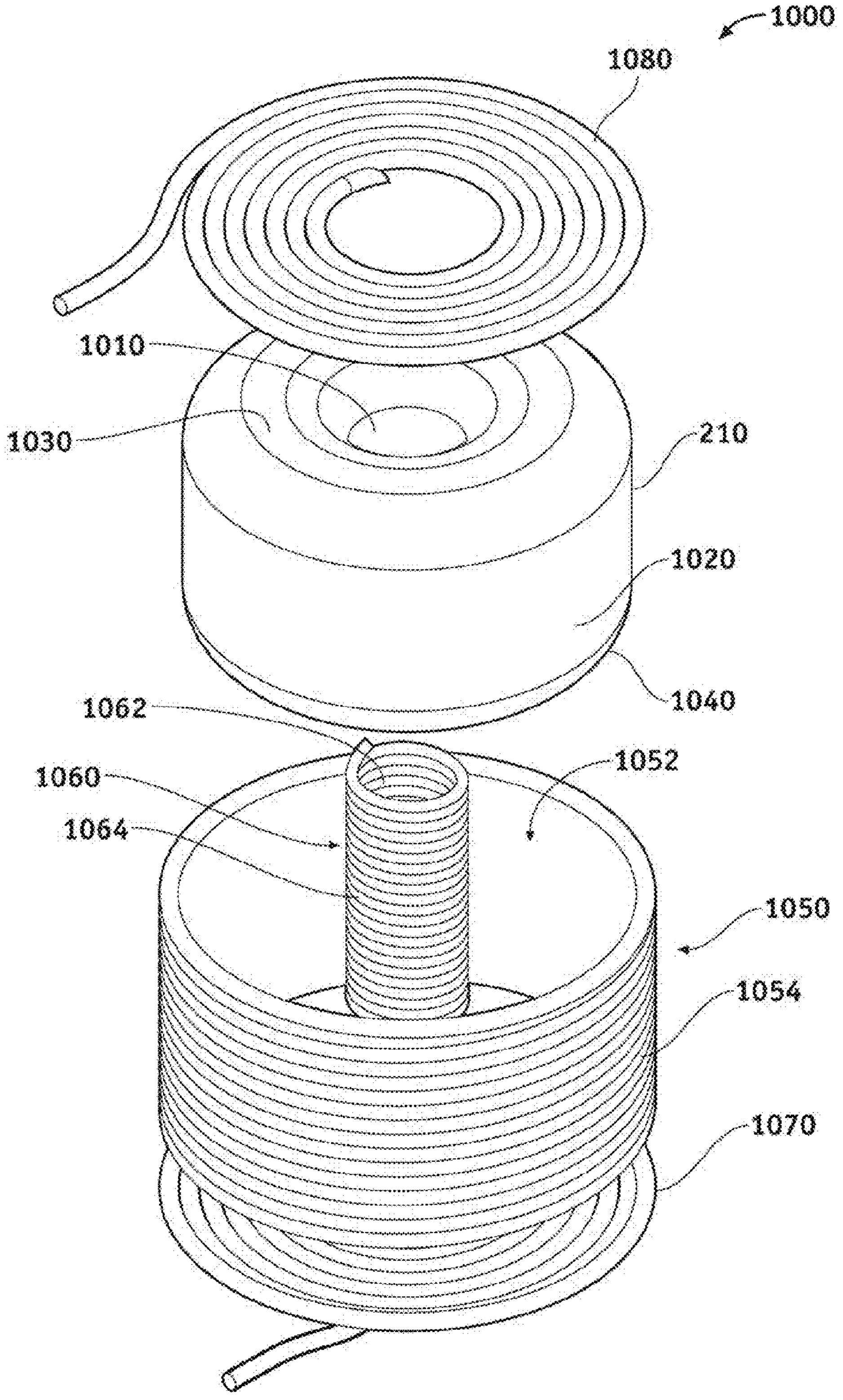
Figure 11:
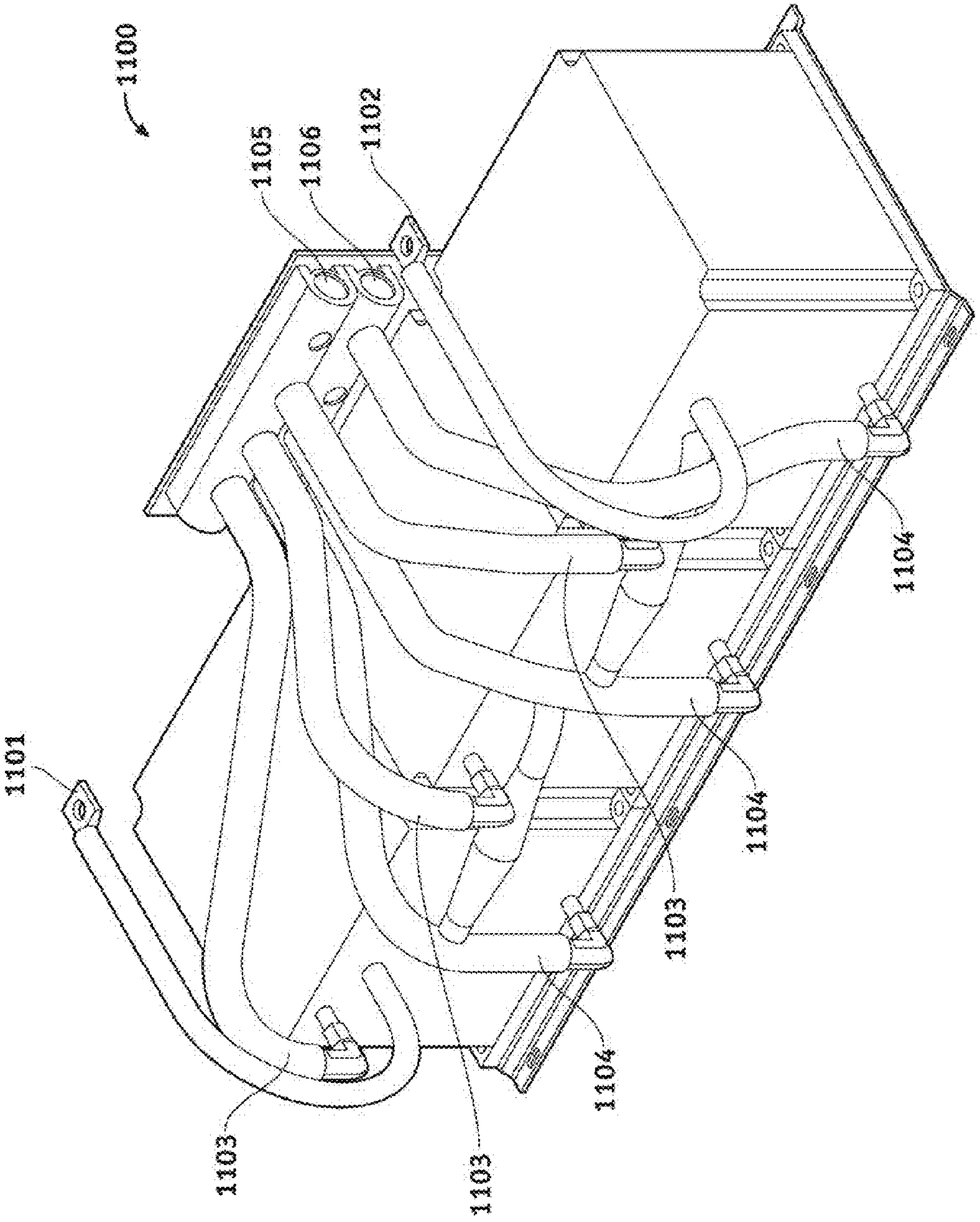
Figure 12:
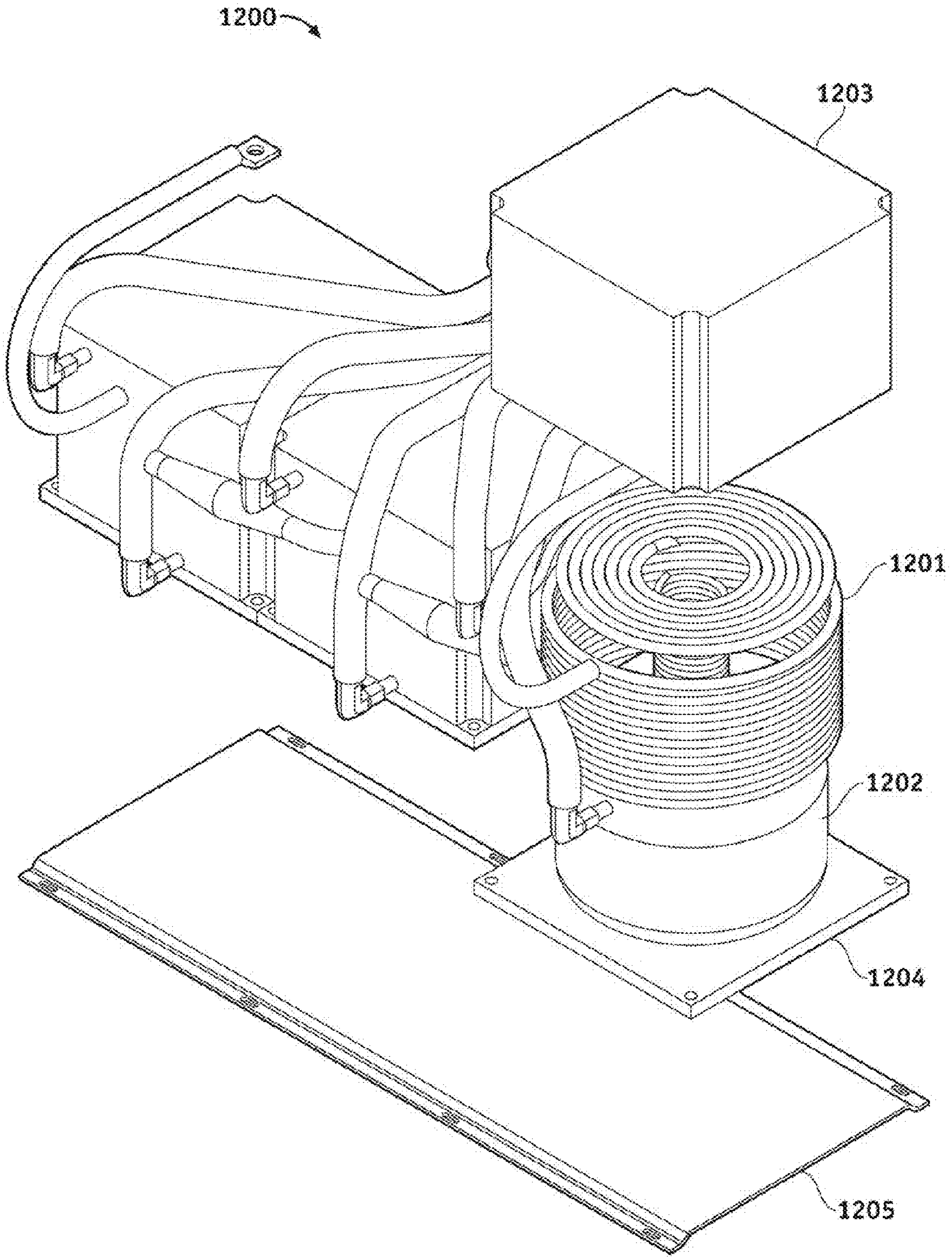
Figure 13:
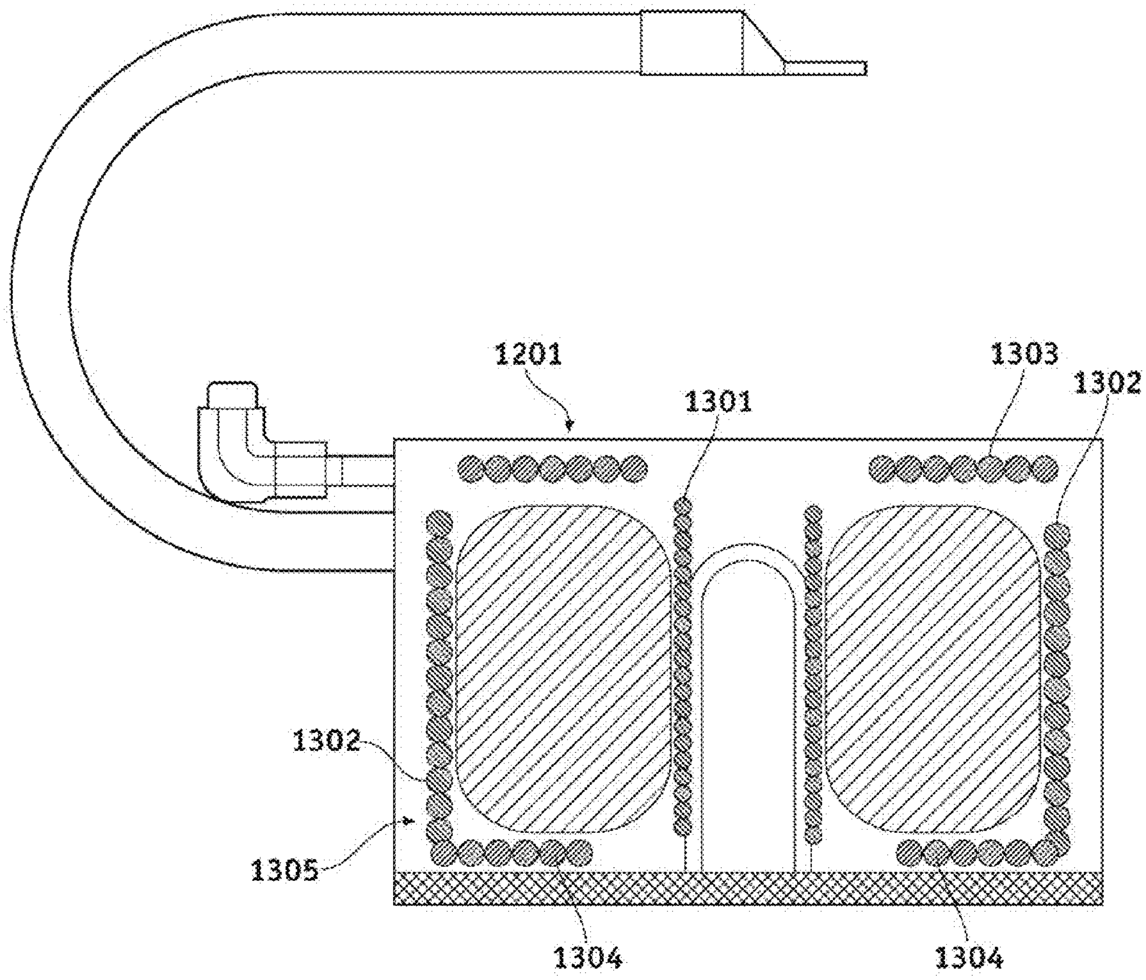
Figure 14:
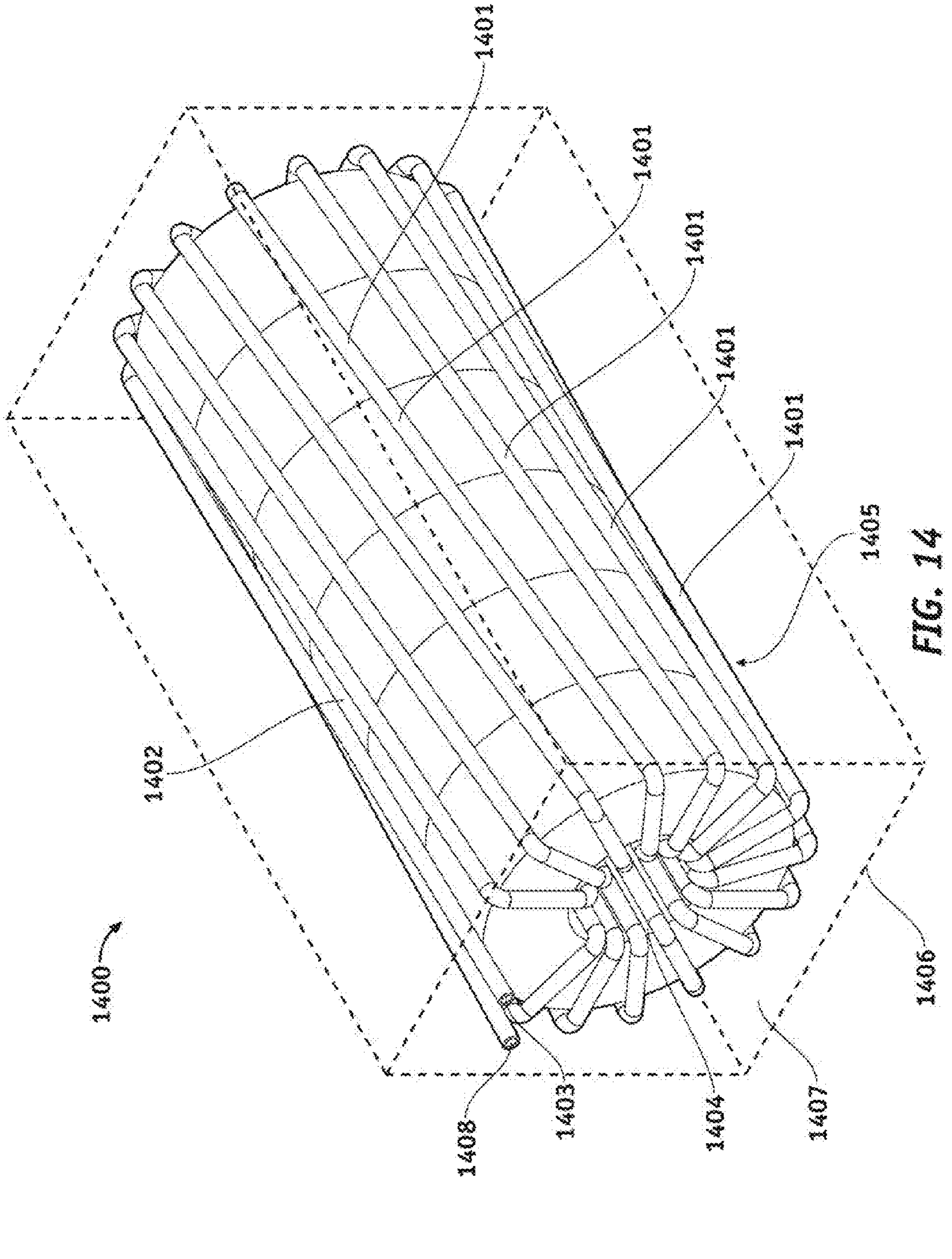
Figure 15A:
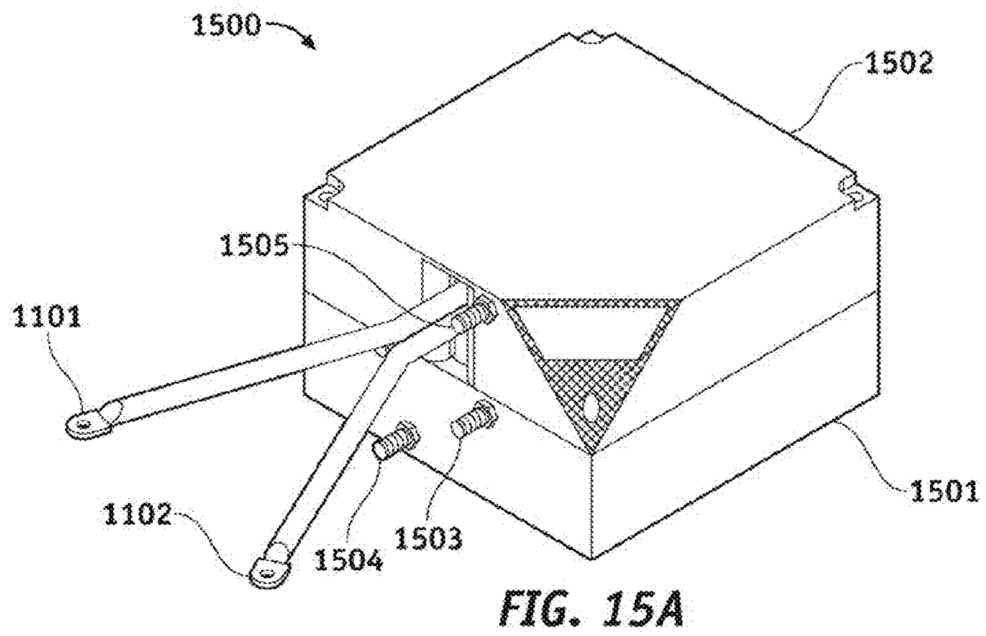
Figure 15B:
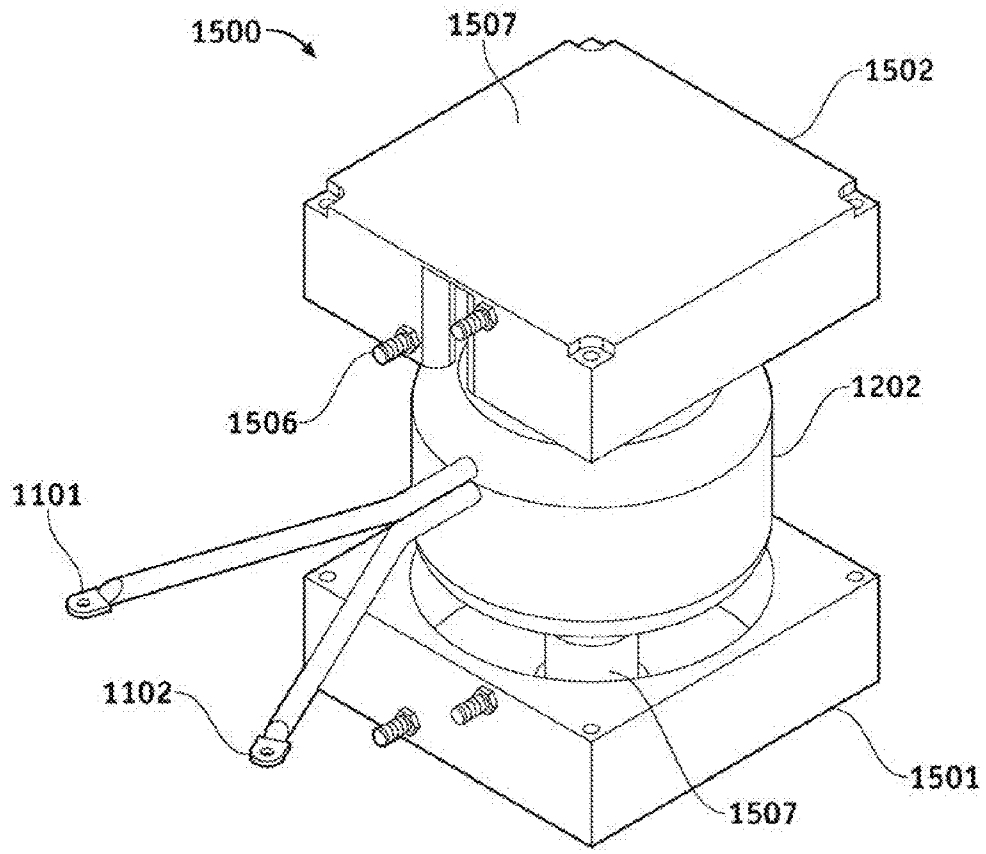
Figure 16:
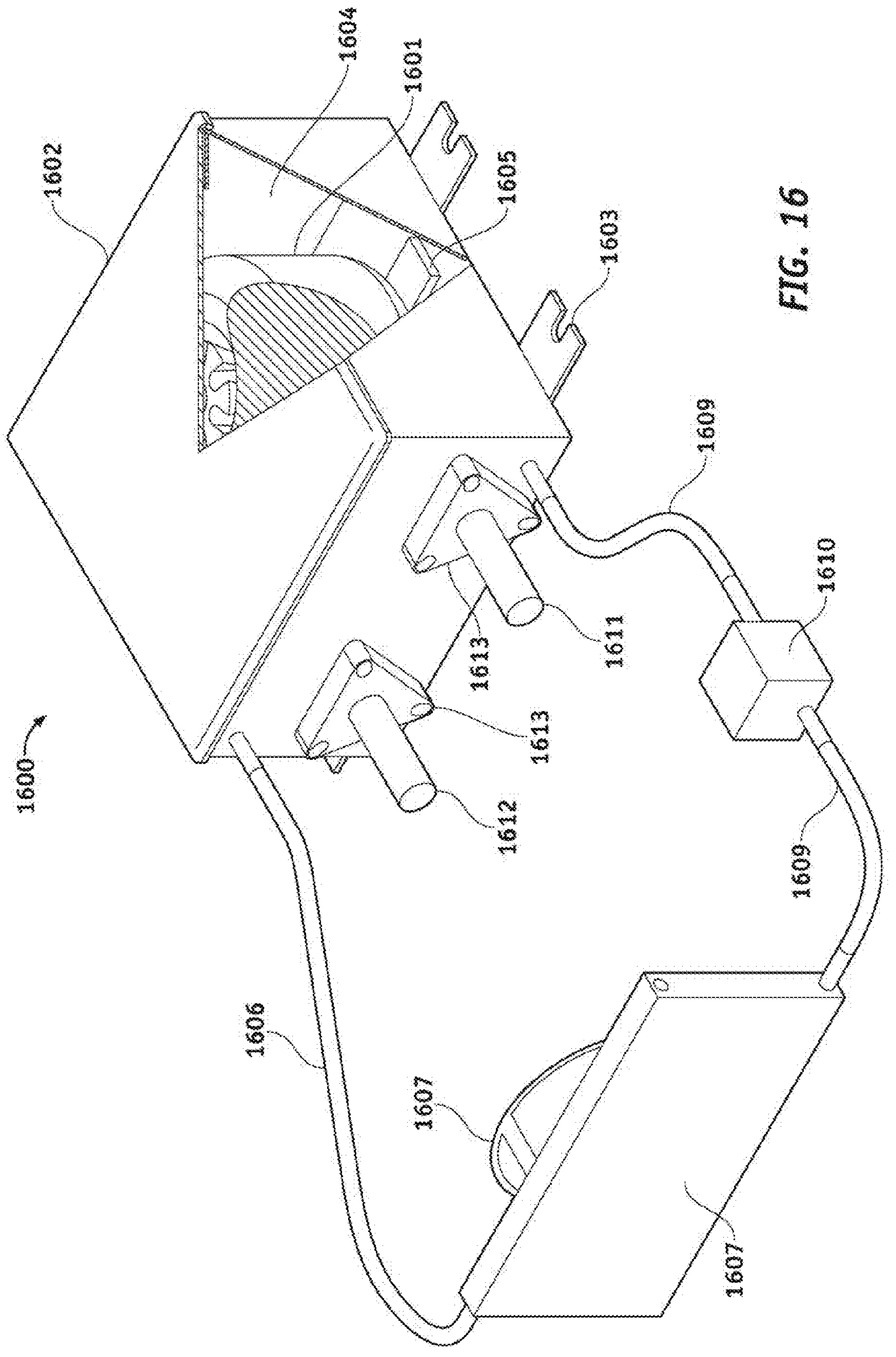
Figure 17:
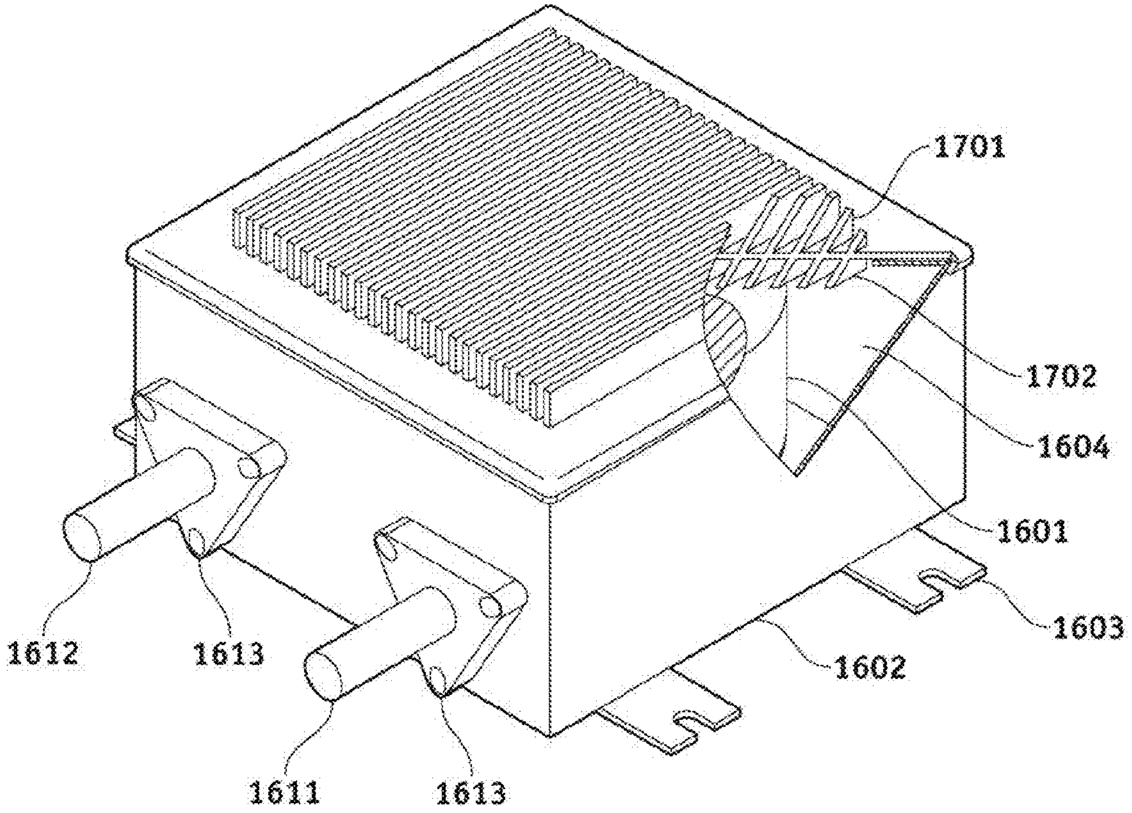
Figure 19:
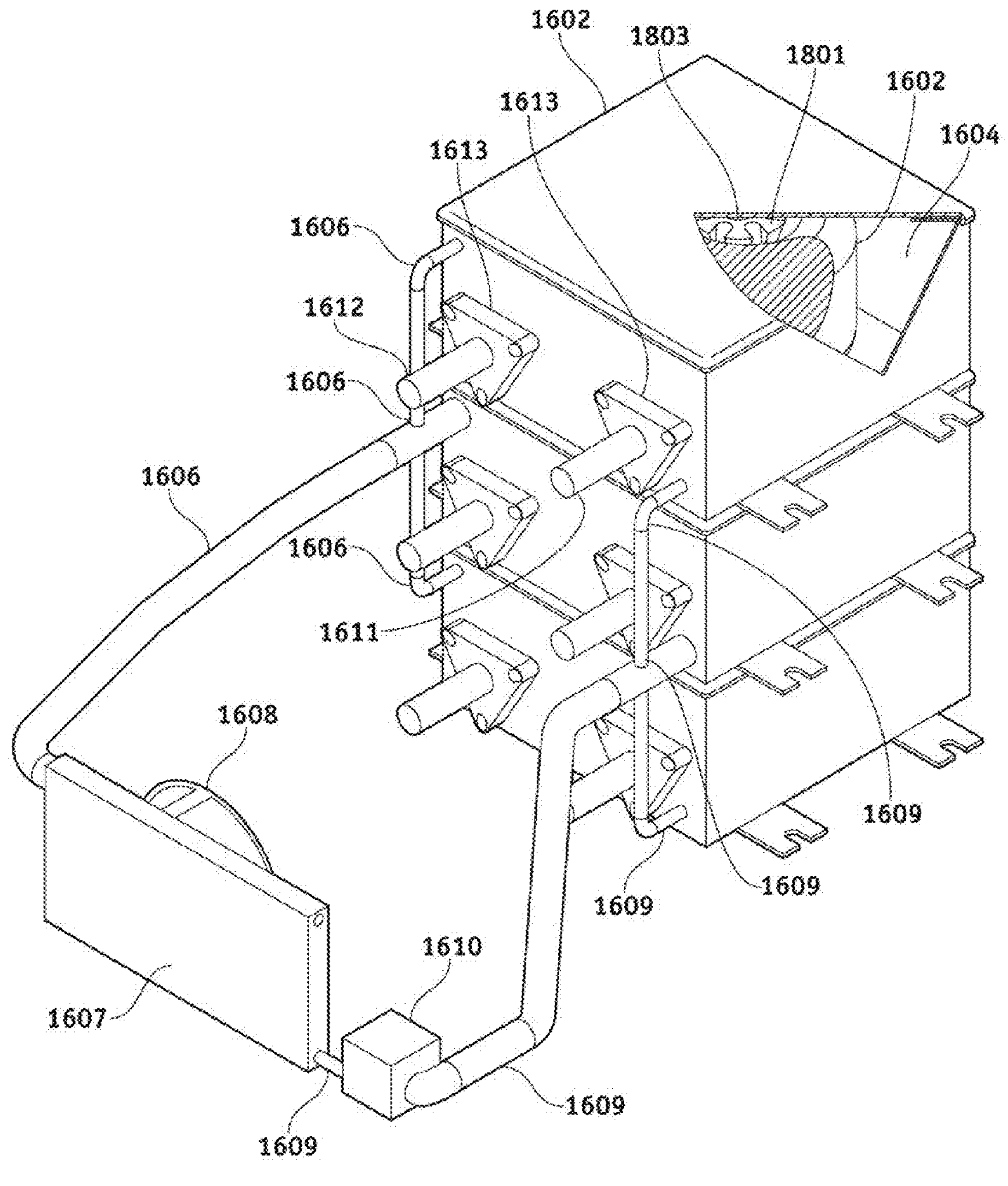

FIGS. 9A-F are illustrations of various aspects of an exemplary electrical system including a coolant system;

FIG. 10 is an exploded view representation of an inductor cooling system;

FIG. 11 illustrates a multi-core cooling system;

FIG. 12 provides an exploded view of a multi-core cooling system;

FIG. 13 is a cross section view of a potted inductor;

FIG. 14 illustrates a multi-core cooling system;

FIGS. 15A-B illustrate a multi-section cooling system;

FIG. 16 illustrates an inductor cooling system;

FIG. 17 illustrates an inductor cooling system;

FIGS. 18A-D illustrate a spacer mounted inductor;

FIG. 19 illustrates a poly-phase cooling system; and

Figure 20:
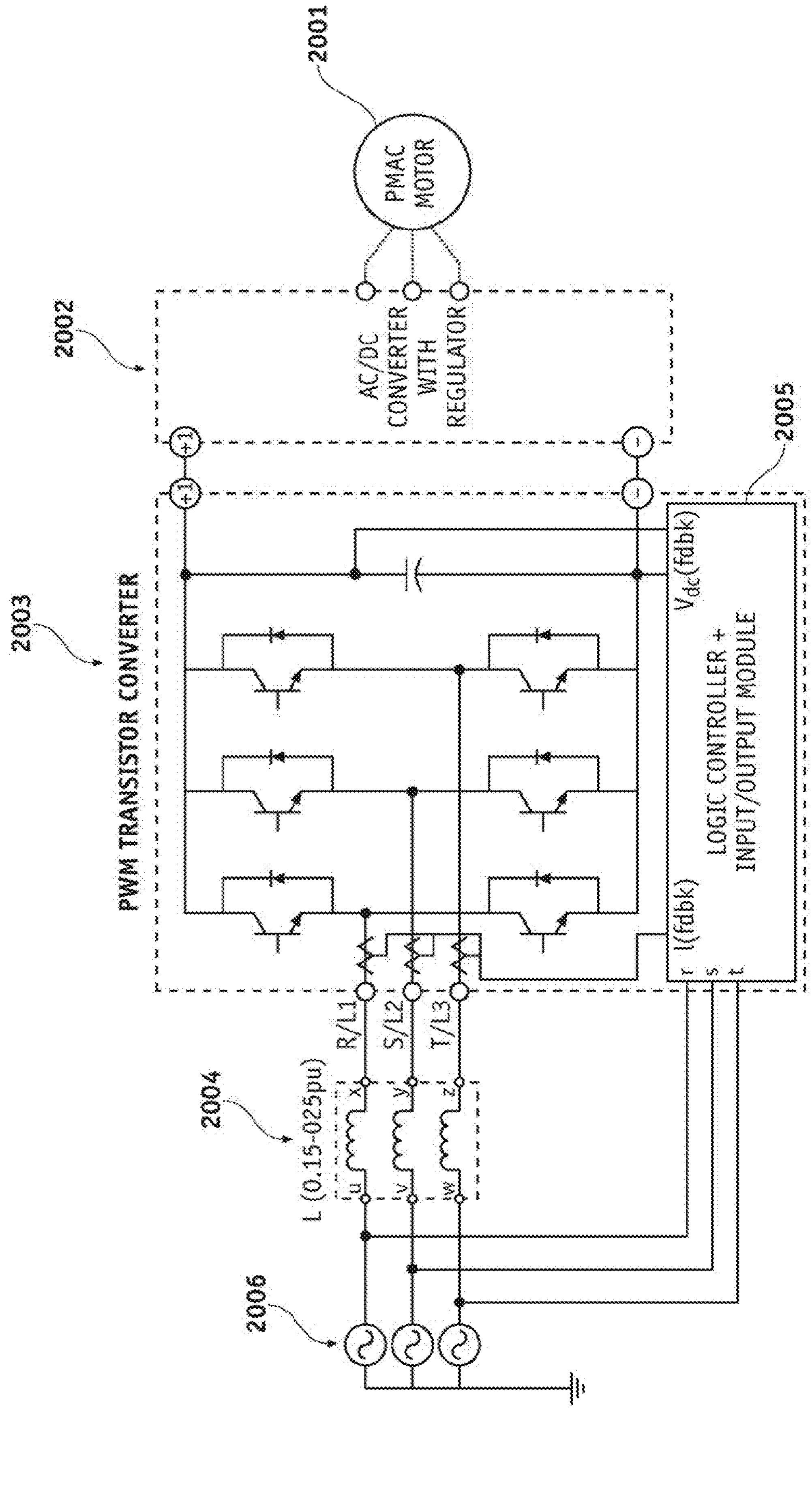

FIG. 20 is a schematic diagram of a power generation and filter system.

Elements and steps in the figures are illustrated for simplicity and clarity and have not necessarily been rendered according to any particular sequence. For example, steps that are performed concurrently or in different order are illustrated in the figures to help improve understanding of embodiments of the present invention.

DETAILED DESCRIPTION OF THE EXEMPLARY EMBODIMENTS

The present invention is described partly in terms of functional components and various assembly and/or operating steps. Such functional components are realized by any number of components configured to perform the specified functions and achieve the various results. For example, implementations of the present invention may include various elements, materials, windings, cores, filters, supplies, loads, passive and active components, coolants, pumps, heat exchangers, enclosures, and flow management tools. In addition, various aspects of the present invention may be practiced in conjunction with any number of applications, environments, and passive circuit elements. The systems and components described are merely exemplary applications for the invention. Further, the present invention may incorporate any number of conventional techniques for manufacturing, assembling, connecting, operating, and the like.

Figure 1A:
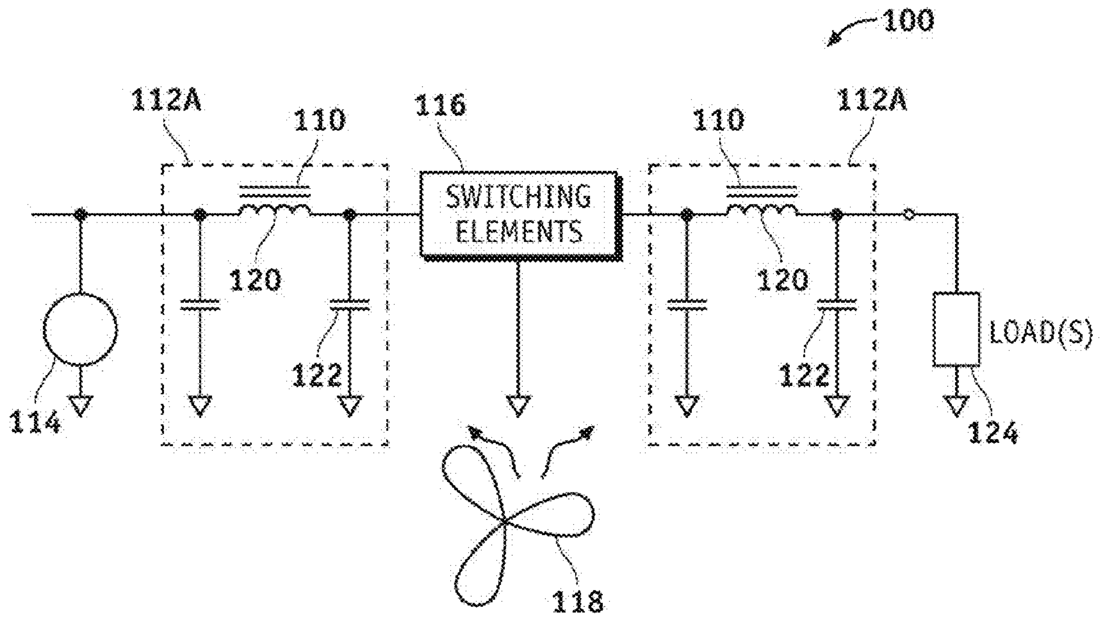
Figure 1B:
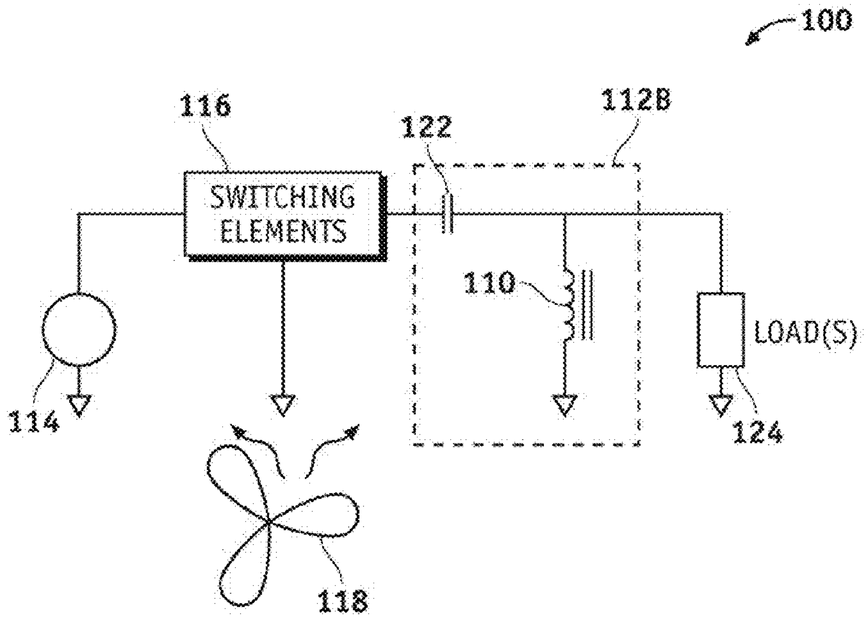

Methods and apparatus for electrical components according to various aspects of the present invention may operate in conjunction with an electromagnetic component, such as in an electrical system. Referring now to FIGS. 1A and 1B, an exemplary electrical system 100 according to various aspects of the present invention includes an electromagnetic component 110 operating in conjunction with an electric current to create a magnetic field, such as with a transformer and/or an inductor. In an exemplary embodiment of an electrical system according to various aspects of the present invention, the electrical system 100 comprises a power supply or inverter/converter system including a filter circuit 112, such as a low pass filter 112A or a high pass filter 112B. The power supply or inverter may comprise any suitable power supply or inverter, such as an inverter for a variable speed drive, an adjustable speed drive, or an inverter that transfers power to and/or from an energy device like an electrical transmission line, generator, turbine, battery, flywheel, fuel cell, wind turbine, biomass, or any other high frequency inverters or converters, or other suitable applications or loads 124.

For example, referring to FIG. 20, an exemplary electrical converter system processes AC power. The AC power is converted, regulated, and filtered under control of a logic controller 2005. For example, wind turbine generated energy is processed and delivered to a power distribution grid. A power generation device 2001 generates multi-phase power, such as 3-phase AC power. Initially, a first converter system 2002 converts the AC power to DC power. Subsequently, a second converter system, such as a pulse width modulated transistor converting system 2005, reconstitutes the DC power into AC power, such as frequency and voltage controlled AC power.

For example, the initial AC power from the turbine is now processed to 60 Hz power. The output of the second converter system is filtered at a filter stage 2004 under control of the logic controller 2005. The resulting AC width adjusted and filtered power is delivered to a power distribution grid 2006.

The electrical system 100 may comprise, however, any system using the electromagnetic component 110. Electrical systems 100 comprising the electromagnetic component 110 may be selected and/or adapted for any suitable application or environment, such as variable speed drive systems, uninterruptible power supplies, backup power systems, inverters, and/or converters for renewable energy systems, hybrid energy vehicles, tractors, cranes, trucks and other machinery using fuel cells, batteries, hydrogen, wind, solar, and other hybrid energy sources, regeneration drive systems for motors, motor testing regenerative systems, and other inverter and/or converter applications. For example, an exemplary electrical system 100 may comprise a backup power system including one or more superconducting magnets, batteries, flywheels, and DVAR technologies. In addition, electrical systems 100 may comprise renewable energy systems including, for example, solar cells, fuel cells, wind turbines, hydrogen converters, and natural gas turbines.

In various embodiments, the electrical system 100 is adaptable for energy storage or generation systems using direct current (DC) or alternating current (AC) electricity configured to backup, store, or generate distributed power. Various aspects of the present invention are particularly suitable for high current applications, such as at or above about 50 amperes (A), including currents greater than about 100 A, such as currents greater than about 200 A, and more particularly currents greater than about 400 A, as well as to electrical systems exhibiting multiple combined signals, such as one or more pulse width modulated (PWM) higher frequency signals superimposed on a lower frequency waveform. For example, in the present embodiment, a switching element 116 may generate a PWM ripple on a main supply waveform. Such electrical systems operating at currents greater than about 100 A operate within a field of art substantially different than low power electrical systems, such as those operating at sub-ampere levels or at about 2, 5, 10, 20 or 50 amperes.

In particular embodiments, various aspects of the present invention may be adapted for high-current inverters and converters. An inverter may produce alternating current from direct current (DC). A converter may process AC or DC power to provide a different electrical waveform. The term converter denotes a mechanism for either processing AC power into DC power, which is a rectifier, or deriving power with an AC waveform from DC power, which is an inverter. An inverter/converter system is either an inverter system or a converter system. Converters are used for many applications, such as rectification from AC to supply electrochemical processes with large controlled levels of direct current; rectification of AC to DC followed by inversion to a controlled frequency of AC to supply variable-speed AC motors; interfacing DC power sources, such as fuel cells and photoelectric devices, to AC distribution systems; production of DC from AC power for subway and streetcar systems; production of controlled DC voltage for speed-control of DC motors in numerous industrial applications; and transmission of DC electric power between rectifier stations and inverter stations within AC generation and transmission networks.

In one embodiment, the supply provides a high AC current to a load 124. The power supply system includes any other appropriate elements or systems, such as a voltage or current source 114 and a switching system or element 116. The supply may also include a cooling system 118, such as a heat sink, a fan, and/or a circulating coolant system. The supply may further operate in conjunction with various forms of modulation, including pulse width modulation, resonant conversion, quasi-resonant conversion, phase modulation, or any other suitable form of modulation.

The switching elements 116 may comprise any switching elements for the particular application, such as integrated gate bipolar transistors (1 GBTs), power field effect transistors (FETs), gate turn off devices (GTOs), silicon controlled rectifiers (SCRs), triacs, thyristors, or other appropriate switches. For example, for high-current power inverters and converters, the switching elements 116 may include a thyristor, which is a silicon-controlled rectifier. Thyristors are often employed in converter applications due to their ruggedness, reliability, and compactness. The switching elements 116 may comprise any appropriate elements for making and breaking a circuit, however, such as conventional power semiconductor devices for converter circuits. Such semiconductor devices may include thyristors, triacs, gate turn-off devices with the properties of thyristors and the further capability of suppressing current, and power transistors. Such devices are available with ratings from a few watts up to several kilovolts and several kiloamperes. Low voltage and/or low amperage systems do not scale to high voltage and/or high amperage power systems, such as in excess of about fifty amperes.

The filter circuits 112A, 112B are configured to filter selected components from the supply signal. The selected components comprise any elements to be attenuated or eliminated from the supply signal, such as noise and/or harmonic components, for example to reduce total harmonic distortion. In the present embodiment, the filter circuits 112A, 112B are configured to filter higher frequency harmonics over the fundamental frequency, which is typically DC, 50 Hz, 60 Hz, or 400 Hz, such as harmonics over about 300 or 500 Hz in the supply signal, for example harmonics induced by the operating switching frequency of 1 GBTs and/or any other electrically operated switches. The filter circuits 112A, 112B may comprise passive components including one or more electromagnetic components 110, such as including an inductor-capacitor filter comprising an inductor 120 and a capacitor 122. The values and configuration of the inductor 120 and the capacitor 122 are selected according to any suitable criteria, such as to configure the filter circuits 112A, 112B for a selected cutoff frequency, which determines the frequencies of signal components filtered by the filter circuit. The inductor 120 may be configured to operate according to selected characteristics, such as in conjunction with high current without excessive heating or exceeding safety compliance temperature requirements.

Figure 2:
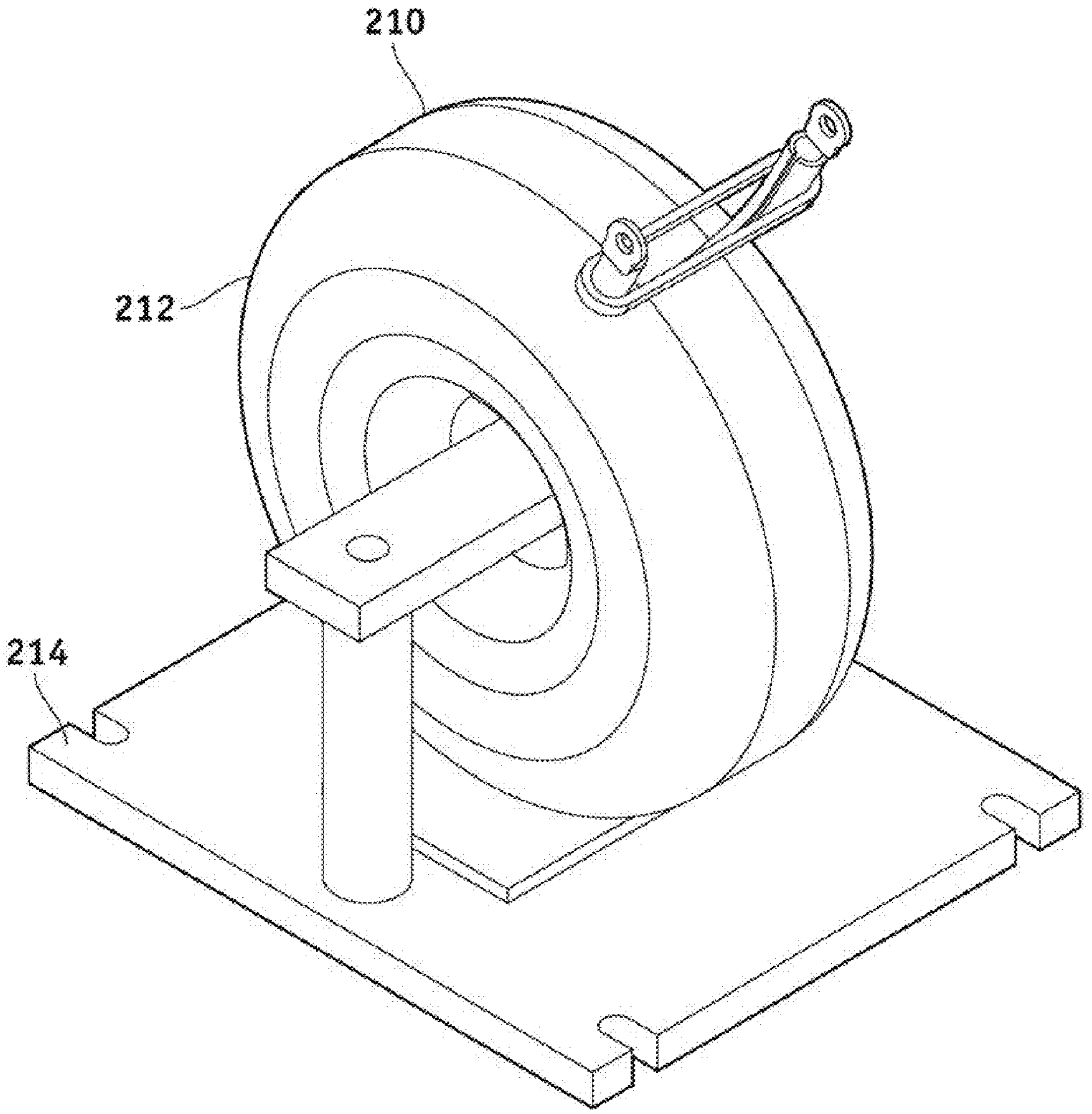
FIG. 2 is a perspective view of an inductor.
Figure 4A:
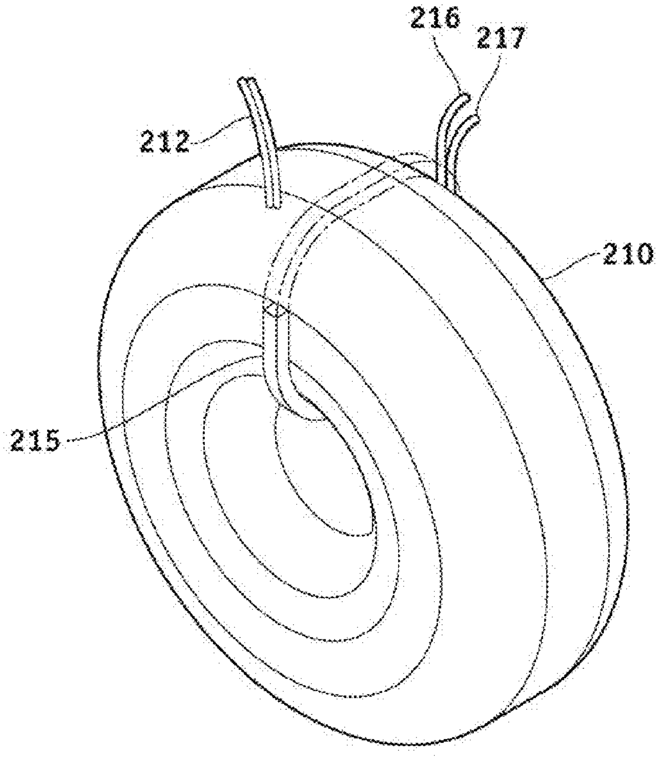
FIGS. 4A and 4B are perspective and cross-sectional views, respectively, of a multi-layered winding configuration.
Figure 4B:
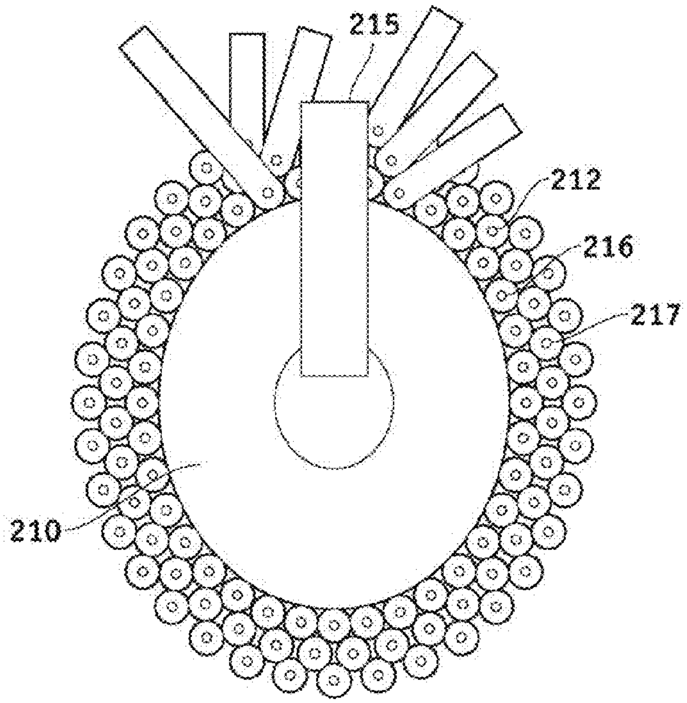

Referring to FIGS. 2 and 4A-B, an inductor 120 according to various aspects of the present invention comprises a core 210 and a winding 212. The winding 212 is wrapped around core 210. The core 210 and winding 212 are suitably disposed on or in a mount 214 and/or housing to support the core 210 in any suitable position and/or to conduct heat away from the core 210 and the winding 212. The inductor 120 may also include any additional elements or features, such as other items required in manufacturing. In addition, the electrical system 100 may include other elements in addition to or instead of the inductor 120.

In the present exemplary inductor 120, the core 210 provides mechanical support for the winding 212 and may comprise any suitable core 210 for providing the desired magnetic permeability and/or other characteristics. The configuration and materials of the core 210 may be selected according to any suitable criteria, such as BH curve profiles, permeability, availability, cost, operating characteristics in various environments, ability to withstand various conditions, heat generation, thermal aging, thermal impedance, thermal coefficient of expansion, curie temperature, tensile strength, core losses, and compression strength. For example, the core 210 may configured to exhibit a selected permeability and BH curve. Selecting an appropriate BH curve may allow creation of inductors 120 having smaller components, reduced electromagnetic emissions, reduced core losses, and increased surface area in a given volume compared to inductors using conventional materials, such as laminated silicon steel or conventional silicon iron steel.

Figure 3:
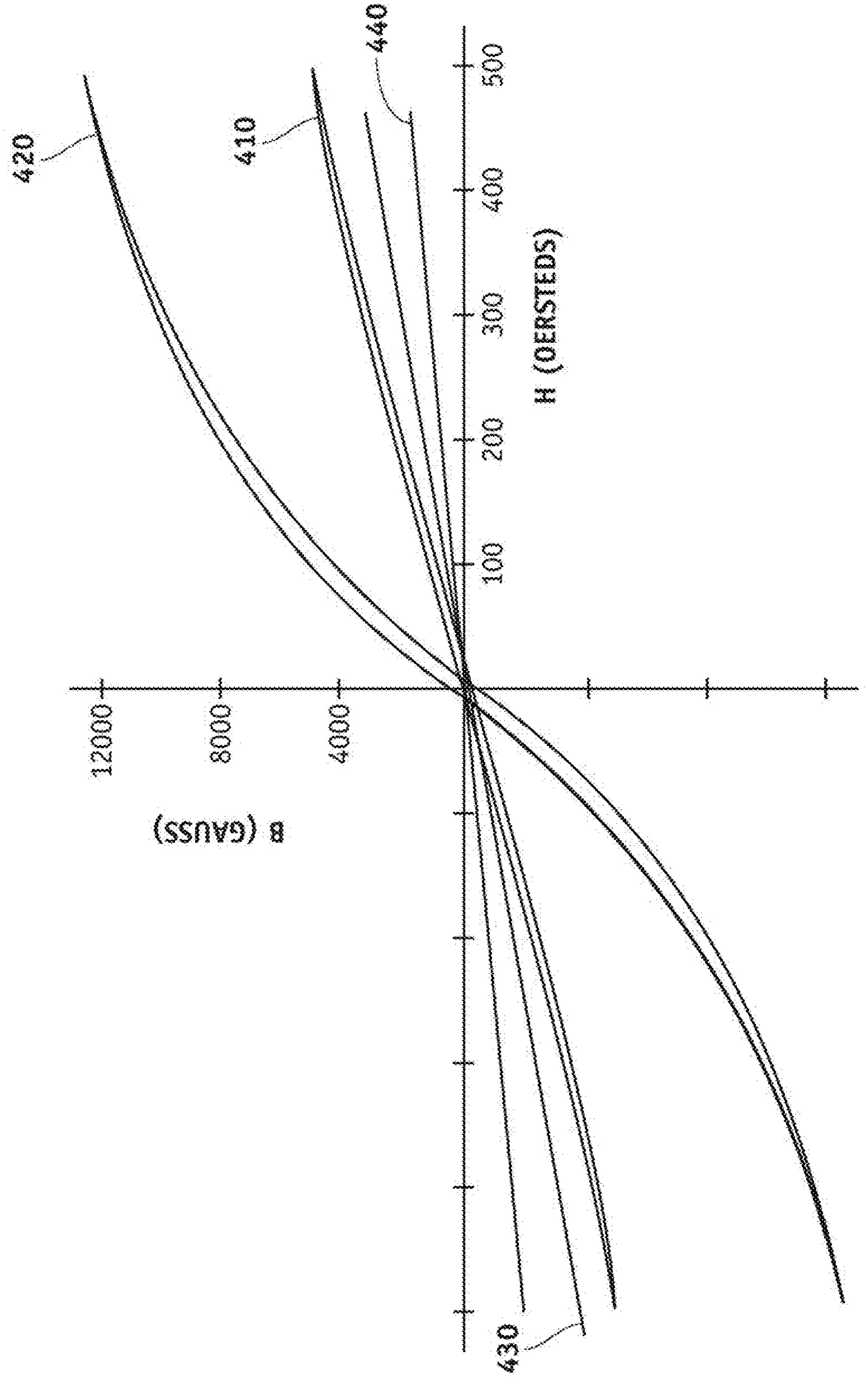
FIG. 3 is a plot of magnetic field as a function of magnetic flux density in Gauss (B) and magnetic field intensity in Oersteds (H).

Referring to FIG. 3, magnetic field is described in conjunction with two quantities, Gauss (B) and Oersted (H). The vector field, H, is the magnetic field intensity or magnetic field strength, also referred to as auxiliary magnetic field or magnetizing field. The vector field, H, is a function of applied current. The vector field, B, is known as magnetic flux density or magnetic induction and has the SI units of Teslas (T). Thus, a BH curve is induction, B, as a function of the magnetic field, H.

The permeability of the core 210 may be represented as the slope of $\Delta B/\Delta H$. The core 210 is characterized by the permeability corresponding to a capability for storing a magnetic field in response to current flowing through the winding 212. In the present embodiment, the core 210 is configured to exhibit low core losses under various operating conditions, such as in response to a high frequency pulse width modulation or harmonic ripple, compared to conventional materials, such as laminated silicon steel or silicon iron steel designs. Selecting the appropriate BH curve allows creation of inductors having smaller components, reduced emissions, reduced core losses, and increased surface area in a given volume compared to inductors using conventional materials, such as laminated silicon steel or conventional silicon iron steel.

Referring now to Table 1, exemplary inductance B levels for the core 210 as a function of magnetic force strength are provided. The core 210 material may exhibit an inductance of about −4400 to 4400 B over a range of about −400 to 400 H with a slope of about 11 $\Delta B/\Delta H$. A linear BH curve corresponds to inductance stability over a range of changing potential loads, from low load to full load to overload. In the present embodiment, the core 210 comprises a material having a substantially linear BH curve with $\Delta B/\Delta H$ in the range of about 10 to 12 over the relevant range of current. In another embodiment, the core 210 material exhibits a substantially constant permeability slope of less than nine over a range of −300 to +300 H.

In other embodiments, core materials having a substantially linear BH curve with a permeability $\Delta B/\Delta H$ in the range of exactly or about 9 to 13 may be employed. Alternatively, the inductor 120 may exhibit a permeability of less than seven delta Gauss per delta Oersted at a load of four hundred Oersteds, a permeability in the range of four to six delta Gauss per delta Oersted at a load of four hundred Oersteds, or a permeability in the range of four to nine delta Gauss per delta Oersted over loads ranging from one hundred to four hundred Oersteds.

TABLE 1

| Typical Permeability 11 BH Response | |
|---|---|
| B (Tesla/Gauss) | H (Oersteds) |
| −4400 | −400 |
| −2200 | −200 |
| −1100 | −100 |
| 1100 | 100 |
| 2200 | 200 |
| 4400 | 400 |

The core 210 may comprise any appropriate material meeting the desired permeability and BH curve requirements, such as an iron powder material or multiple materials to provide a particular BH curve. For example, the core 210 may comprise pressed carbonyl powder material with a permeability of about ten. In the present embodiment configured for smaller components, reduced electromagnetic emissions, reduced core losses, and increased surface area in a given volume, the core may comprise a pressed powdered iron alloy material. The values in Table 1 approximate the BH characteristics of a material that exhibits a substantially linear flux density response to magnetizing forces over a large range with very low residual flux, Br. In one embodiment, the core 210 material exhibits a residual flux of about thirty-six Gauss.

Referring again to FIG. 3, a BH curve 420 for a conventional silicon, iron lamination core configuration having no central opening has a substantially non-linear permeability curve 420, exhibiting a linear slope from approximately −100 to 100 H and substantially falling off of the linear slope defined in the −100 to 100 H range at higher applied loads, such as above 100 or below −100 H. A BH curve for another material 410 has a substantially linear permeability with a slope of about 11, which additionally reduces core losses at frequencies greater than 300 or 500 Hertz.

The core 210 may comprise any appropriate material meeting the desired permeability and BH curve requirements, such as an iron powder material or multiple materials to provide a particular BH curve. For example, the core 210 may comprise pressed carbonyl powder material with a permeability of about ten. In the present embodiment configured for smaller components, reduced electromagnetic emissions, reduced core losses, and increased surface area in a given volume, the core may comprise a pressed powdered iron alloy material.

The core 210 may also include a gap, which may affect the permeability of the core 210. In the present embodiment, the core 210 may comprise a pressed powdered iron alloy material, which forms a distributed gap introduced by the powdered material and one or more bonding agents. Substantially even distribution of the bonding agent within the iron powder of the core results in the equally distributed gap of the core.

The core 210 may include no gap, a distributed gap, multiple gaps, or a single gap. Conventional inductor construction requires gaps in the magnetic path of the steel lamination, which are typically outside the coil construction and are, therefore, unshielded from emitting flux, causing electromagnetic radiation. The electromagnetic radiation can adversely affect the electrical system. In the present embodiment, the distributed gaps in the magnetic path of the present core 210 material are microscopic and substantially evenly distributed throughout the core 210. The significantly smaller flux energy at each gap location is also surrounded by the winding 212, which acts as an electromagnetic shield to contain the flux energy.

The gap may affect the permeability of the core 210 material. Referring still to FIG. 3, BH curves 430, 440 for pressed powder alloy or powder cores mixed with a bonding agent also exhibit substantially linear permeabilities of approximately eight and four, respectively. The BH curves having permeabilities of eight and four have a substantially equally distributed gap on the scale of the bonding agent spacing within the powder particles and operate with a nearly linear slope over applied loads from −300 to 300 H and operate with a substantially linear flux density response over a range of magnetizing force strengths, such as about −400 to 400 H, thus producing a near constant inductance value over the full operating range of the power system. For example, the core 210 corresponding to curve 440 comprised of pressed powder cores has a substantially constant slope, indicating substantially linear permeability, compared to the slope of the conventional core material BH curve 420, which has a non-linear permeability in response to changing magnetizing force.

In addition, the core 210 may comprise a hybrid core including multiple materials. For example, the permeabilities of the multiple materials may differ, and the materials may be arranged in may appropriate manner to achieve selected core characteristics. The relative amounts of each material may also be varied, ranging from about 1 to 99 percent of the volume of the core 210. The core 210 may comprise any number of different materials formed in any arrangement to achieve desired characteristics.

Figure 7A:
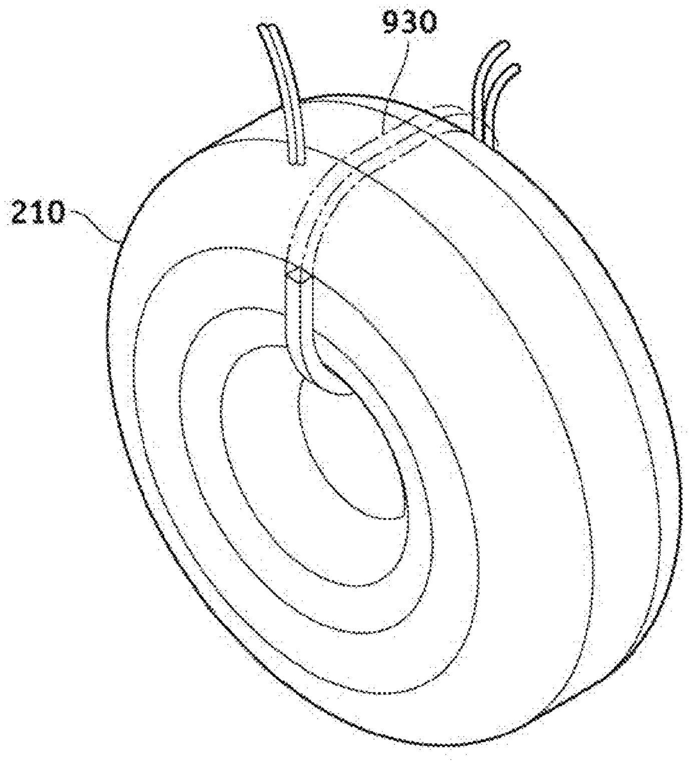
FIGS. 7A and 7B are a perspective view and a cross-sectional view of a hybrid core, respectively.
Figure 7B:
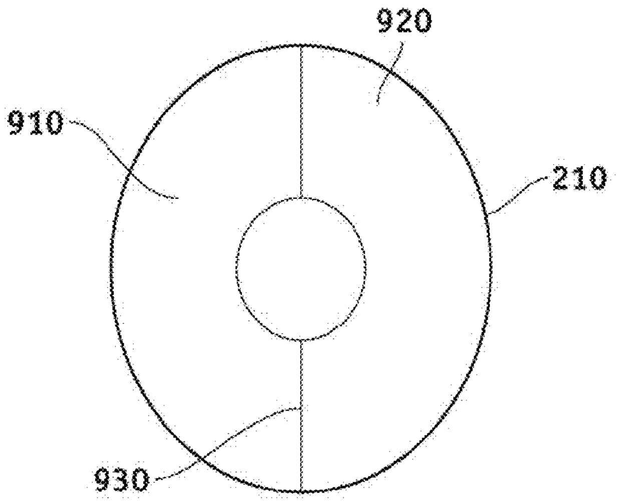

For example, referring to FIGS. 7A and 7B, the core 210 may comprise a hybrid core 740. The hybrid core 740 may comprise a first material 710 and a second higher permeability material 720, yielding a composite material having a BH curve optimized for performance, weight, size, and cost. In one embodiment, the hybrid core 740 comprises a first high permeability material 740 joined by a bonded joint 730 to the higher permeability material 720. Thus, the hybrid core 210 provides a magnetic path having a hybrid or custom BH curve. The hybrid core 210 may exhibit reduced core loss compared to a core made entirely of the higher permeability material 720, while still exhibiting acceptable saturation characteristics in its corresponding BH curve under load and/or overload condition. The hybrid core 210 may provide advantageous characteristics compared to conventional silicon iron steel.

For core 210 materials having low permeability, the winding 212 may require additional turns compared to higher permeability cores to achieve desired electrical characteristics. In some embodiments, the filter circuits 112A and 112B include multiple inductors 120 configured in parallel and/or series to provide the desired inductance characteristics. Multiple inductors 120 are optionally used in other applications, such as to operate in conjunction with a poly-phase power system where one inductor 120 handles each phase.

The core may be further configured according to any appropriate criteria to meet the requirements of the electrical system 100, for example to maximize the inductance rating $A_L$ of the core 210, enhance heat dissipation, reduce electromagnetic emissions, facilitate winding, optimize size and/or weight, and/or reduce residual capacitances. The core 210 may comprise, for example, a toroid, a square, a rectangle or connected series of rectangles or squares, an E-shape, or other appropriate configuration.

For example, referring to FIGS. 4A-B, the core 210 may comprise a toroid or other substantially annular or circular shape. In the present embodiment, the core 210 comprises a toroid shape of a selected size. The toroid configuration normally exhibits relatively low electromagnetic emissions and provides significant surface area and a curving geometry for increased heat dissipation compared to other core shapes. In addition, the winding 212 may substantially cover the toroid core 210, inhibiting leakage flux from the toroid inductor 120 compared to traditional designs, thus reducing emissions. Further, the windings 212 tend to act as a shield against such emissions. Still further, the lack of corners and edges in the geometry of the windings 212 and the core 210 material render toroidal configurations less prone to leakage flux than conventional configurations.

The core 210 may further include a spacer 215, for example comprising air or other dielectric material. The spacer 215 may be positioned in the body of the annular core between the terminals of the winding 212. The spacer 215 may interrupt the total circumferential annular completion of the core 210. The spacer may comprise any appropriate electrical insulator, such as a non-conductive high temperature-rated material reducing. The spacer 215 may reduce the change in voltage with time potential of the winding 212 and minimize the turn-to-turn capacitance of the winding 212.

The winding 212 comprises a conductor for conducting electrical current through the inductor. The winding 212 comprises any suitable material for conducting current, such as conventional magnet wire, foil, twisted cables, and the like formed of copper, aluminum, gold, silver, or other electrically conductive material. In the present embodiment, the winding 212 comprises copper magnet wire wound around the core 210 in one or more layers. The magnet wire may comprise multiple strands of round wire, which may maximize the amount of copper cross section in a given volume of toroid core. The round wires efficiently fill the available space to minimize the amount of air between copper wire conductors as compared to square or rectangular shape conductors.

Additionally, the winding 212 may further comprise any other suitable material, and the type and configuration of winding 212 and the number of turns and layers are selected according to the desired characteristics of the inductor 120. For example, the winding 212 may comprise multiple strands of conductor in one or more layers. In one embodiment, referring to FIG. 4B, the winding 212 comprises a first conductor 216 and a second conductor 217, wherein the second conductor 217 is wound on top of the first conductor 216 to minimize the voltage between the two conductors. The winding 212 is suitably wrapped around the smallest diameter of the core 210 in a spiral or any other suitable pattern. In one embodiment, the winding 212 comprises multiple strands of wire, such as about twenty, forty, or sixty strands of 12 or 15 American Wire Gauge (AWG) wire, each of which is wrapped around the smallest diameter of the core 210 individually and co-terminated with the other strands such that all of the strands are wired in parallel.

In addition, the present configuration using round magnet wire wound one layer on top of another layer provides a low effective turn-to-turn voltage. The energy stored may be very low as well. Energy stored corresponds to the capacitance times the square of the voltage applied. The energy stored is reduced by the square of the turn-to-turn voltage reduction, thus reducing energy stored in the present configuration.

Further, the self resonant frequency (SRF) is inversely related to energy stored and is a simple test to confirm low energy stored construction. Maintaining a low turn-to-turn capacitance resulting in a high self resonant frequency may minimize corona deterioration where high rate of change of voltage with time (dV/dt) potential exists in filter inductors that carry switching frequencies as well as fundamental line (50/60 Hz) frequencies. The high resonant frequency construction may improve the reliability of the inductor 120. In addition, the winding 212 may utilize specialized magnet wire for use with particular applications, often referred to as inverter grade magnet wire, which may have a secondary silicone or other high dielectric coating in addition to the normal coatings to minimize corona potential.

The mount 214 or housing may comprise any system or device adapted to support the core in any position. In addition, the mount 214 or housing may be configurable to direct heat away from the core 210 and/or to protect the core 210 from the elements. The mount 214 or housing may comprise any suitable material, such as a heat conducting material connected to a heat sink. The mount 214 or housing is suitably configured to minimize its interference with the winding 212 and improve heat radiation characteristics.

The mount 214 or housing and the inductor 120 are configured to operate in a variety of conditions. In one embodiment, the electromagnetic component 110 may be encased in a thermally conductive compound that acts to both aid in heat dissipation and provide protection from the elements, for example in accordance with standards released by the National Electrical Manufacturers Association (NEMA). In alternative embodiments, the housing 214 comprises a thermal transfer medium, such as a thermally conductive material abutting the inductor 120 to transfer heat away from the inductor 120, which may be thermally connected to a heat sink. The housing 214 is configured in any suitable manner to support and/or transfer heat away from the inductor 120, such as in conjunction with an air and/or liquid cooling system.

In one exemplary embodiment, a high power inverter and/or converter system has an inductor with a substantially annular core, such as a circle, doughnut, or toroid. The annular core is composed of at least one material, such as a pressed powder alloy or an iron powder. The pressed powder core is mixed with a bonding agent. Substantially even distribution of the bonding agent within the resultant core results in a substantially equally distributed gap on the scale of the bonding agent spacing within the powder particles.

A conductor substantially contacts the outer surface of the core to form the winding 212. The high power inverter/converter is designed to operate at current levels in excess of 100 amperes, such as in excess of 400 amperes, while yielding a permeability, $\Delta B/\Delta H$, of less than thirteen at an operating load of 400 Oersteds while operating at a frequency of greater than about 500 Hz. Reduced permeability BH curves, such as permeabilities of about 4, 5, 6, 7, 8, 9, or 10 over a range of any combination of −400, −300, −200, −100, 0, 100, 200, 300, and 400 H increase operating efficiency.

The inductor 120 may also be configured to further manage heat generated by the inductor 120. For example, the winding 212 and the core 210 may be configured to effectively dissipate heat, and additional materials, such as housings, heat sinks, potting compounds, and active cooling systems may be added and/or configured to manage heat. In the present embodiment, for example, the toroid configuration of the core 210 has a large surface area available to dissipate heat energy. The large increase in the available winding surface area per cubic volume of the toroid core 210 provides improved heat dissipation compared, for example, to conventional laminated silicon iron steel with concentric wound coils. In addition, the large surface area allows a substantially smaller cross section of copper winding 212 compared to conventional silicon iron steel designs. The reduced winding 212 cross section in the present embodiment yields a configuration that is substantially smaller, less expensive, more efficient to operate, and lighter for a given inductor and cooling system 118.

Figure 5A:
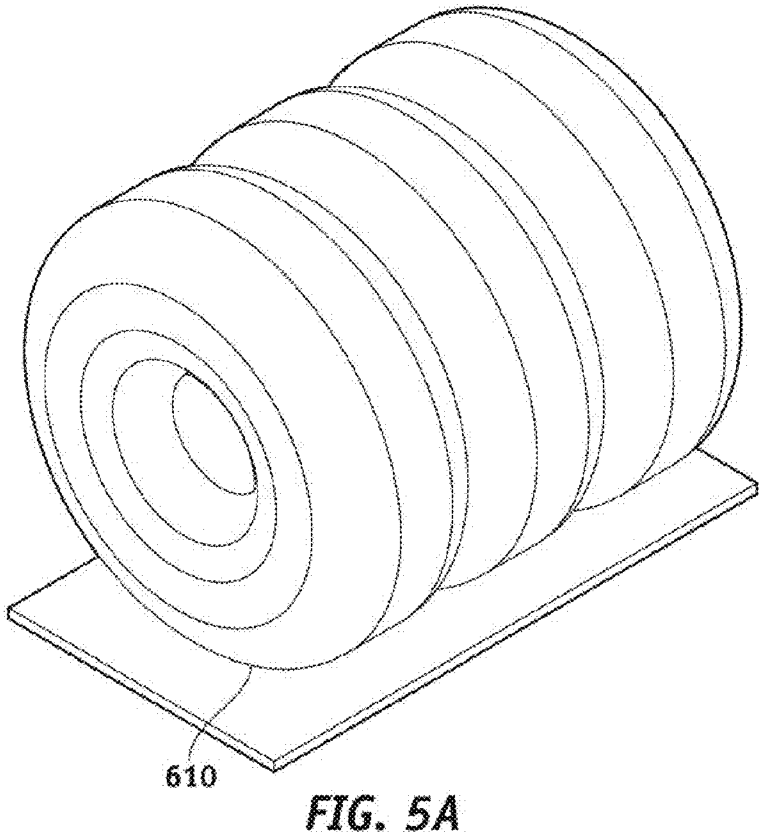
FIGS. 5A and 5B are perspective views of a set of toroidal inductors according to various aspects of the present invention and a conventional inductor configuration, respectively.
Figure 5B:
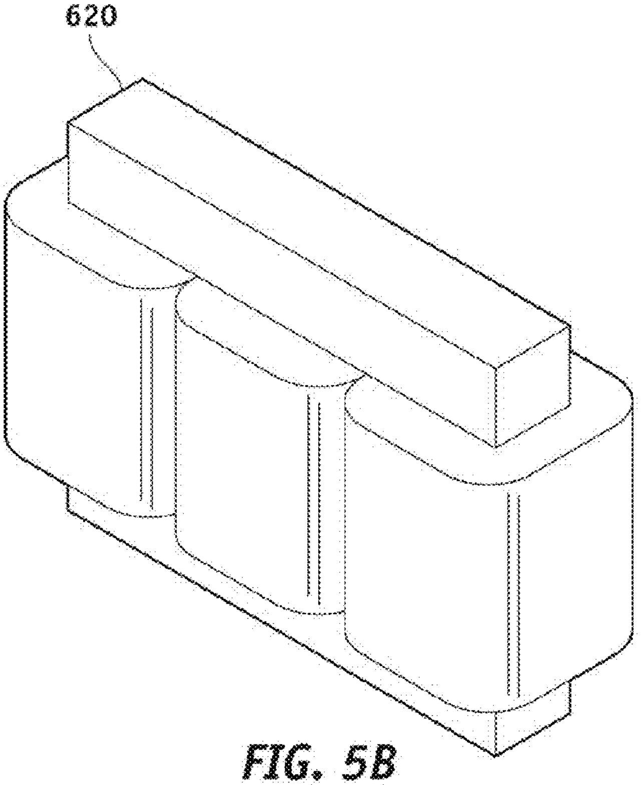

For example, referring now to FIG. 5B, a conventional silicon/iron lamination configuration 620 has no central opening. Consequently, air flow through the center is not possible, inhibiting heat dissipation. Further, the sharp corners and edges disrupt air flow and impede heat dissipation, resulting in poorer performance. Referring now to FIG. 5A, the substantially circular or toroidal design allows heat dissipation, for example via exposure to forced or unforced air or other cooling system through the geometric middle of the core. Further, the curved edges facilitate the use of air- or water-based cooling systems, as the rounded edges of the core and windings facilitate smooth flow of the coolant about the inductor 120.

The toroid inductor geometry facilitates airflow through the inside diameter and/or around the outside diameter of the toroid. The rounded shape of the toroid promotes airflow. In addition, the toroid inductor 120 allows the electrical system 100 to use a combination of individual and separately mounted single phase toroids, which are mountable anywhere inside a system cabinet or enclosure to further improve efficiency and reduce airflow restrictions, unlike the conventional configurations where air cannot easily flow through the center, around the sharp edges, and over the larger bulk of traditional multiphase systems.

In addition, the toroidal shape allows for designs having considerably less cross sectional area of conductor in winding 212 for a given current rating compared to traditional non-circular configurations. Because the conductor 212 is on the outside of the core with a large surface area exposed, heat is readily controlled, for example by passive heat dissipation, active cooling elements, a high thermal transfer compound, and/or a heat sink. The reduction in conductor size reduces the overall size and weight of the inductor 120.

Referring again to FIG. 1, the cooling system 118 may be adapted to remove heat from the inductor 120. Heat transfer may allow the inductor 120 to maintain a steady state temperature under load. The cooling system 118 may comprise any suitable passive and/or active system for cooling one or more elements of the electrical system 100, such as the inductor 120 and/or other elements of the electrical system 100. In various embodiments, the cooling system 118 may comprise a fan, a fluid cooling system, a contained coolant system, and/or a heat sink. In one embodiment, the cooling system 118 comprises an uncontained coolant system, such as a fan blowing air across the inductor 120. In another embodiment, the cooling system 118 may include passive elements, such as a heat sink and/or a thermally conductive compound applied to the inductor 120, which increases the thermal transfer efficiency from the windings 212 and core 210 to a heat sink. In yet another embodiment, the cooling system 118 includes a circulating fluid removing heat from the inductor 120. The cooling system 118 may comprise any appropriate elements or combination of elements to cool one or more components of the electrical system 100.

For example, the electrical system 100 may include a heat sink engaging a heat generating component, such as the inductor 120, to dissipate heat. The heat sink may be configured in any suitable manner to remove heat from the inductor 120. For example, the heat sink may comprise a conventional heat sink exhibiting a high thermal transfer rate, such as a conventional metal heat sink with fins. The heat sink may be configured in any suitable manner, however, to dissipate heat from one or more components of the electrical system 100.

Figure 6:
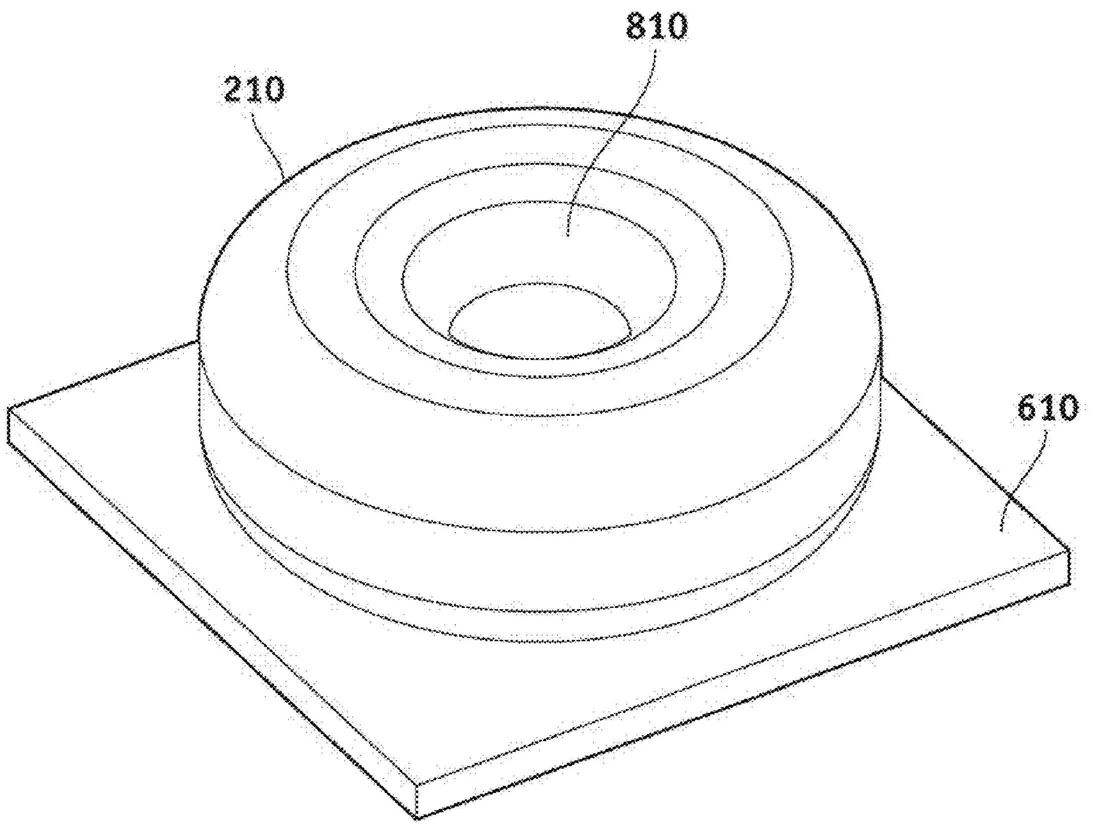
FIG. 6 illustrates an inductor on a heat sink.

The heat sink may be in thermal communication with one or more components of the electrical system 100 to dissipate heat from the component. For example, referring to FIGS. 5A and 6, a heat sink 610 may engage one or more sides of the inductor 120. The heat sink 610 may be attached or thermally connected to the core 210 and/or the winding 212. In the embodiment of FIG. 6, the heat sink 610 is in thermal contact with an axial end of the inductor 120 to maximize the amount of inductor 120 surface area in thermal contact with the heat sink 610. When mounted in such a low profile, low airflow configuration, the inductor 120 promotes heat radiation. Thus, heat generating components may be located proximate to heat radiating elements, unlike considerably larger conventional silicon iron technology, which tends to have many of its hottest components or areas disposed away from a heat sink. In addition, the toroid configuration of the present inductor 120 promotes efficient transfer of thermal energy for improved heat dissipation characteristics in low airflow environments and facilitating use of smaller cooling elements and heat sinks 610.

The cooling system 118 may also comprise an active thermal management system. The active thermal management system circulates air or another coolant in thermal communication with the inductor 120. The coolant absorbs heat from the inductor 120 and moves the heat away, such as to an ambient environment, a ventilation system, or a heat exchanger where the coolant loses the heat. The active thermal management system may comprise any appropriate system and elements for providing a coolant to the inductor 120.

For example, the active thermal management system may comprise a fan to circulate air over the heat sink and/or the heat generating components of the electrical system 100. The fan may comprise any suitable system for moving air, such as one or more conventional cooling fans. In one embodiment, the fan circulates air over the heat sink. Alternatively, the fan may circulate air over the inductor 120 to dissipate heat generated by the inductor. The fan may be configured in any appropriate manner, however, to cool one or more components of the electrical system 100.

Figure 8:
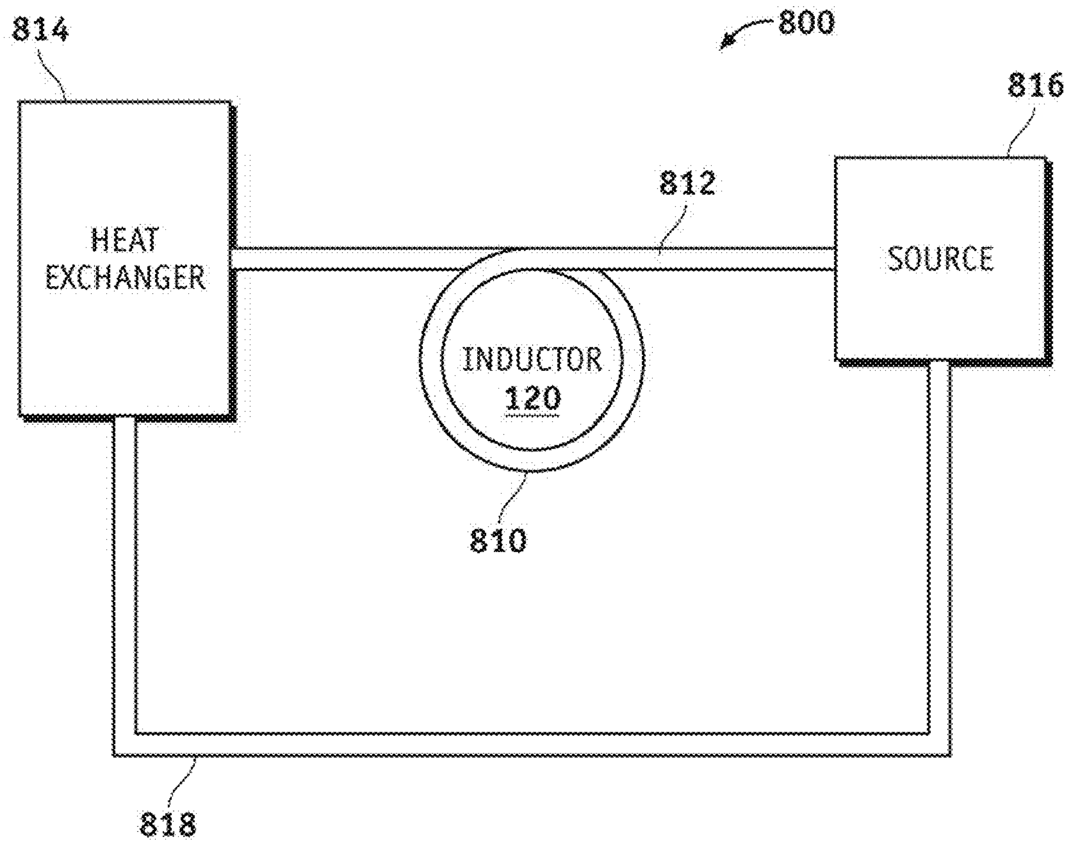
FIG. 8 is a representation of an electrical system including a coolant system.
Figure 9A:
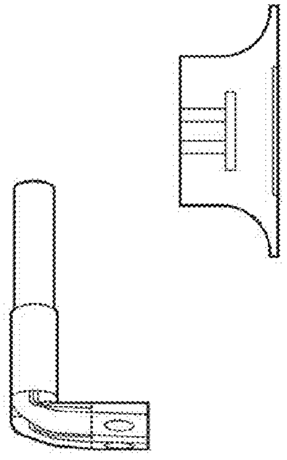
Figure 9B:
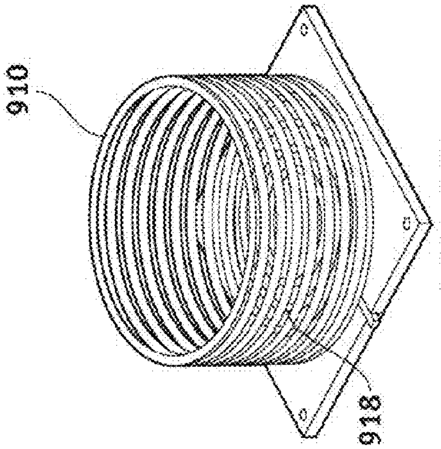
Figure 9C:
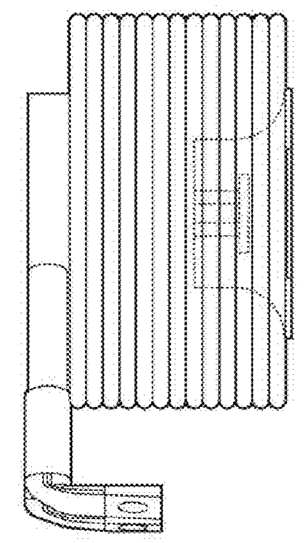
Figure 9D:
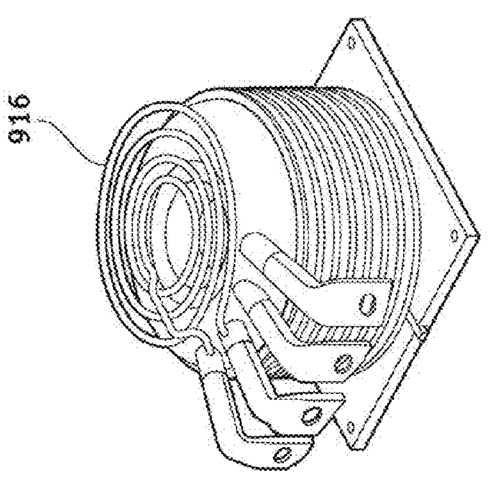
Figure 9E:
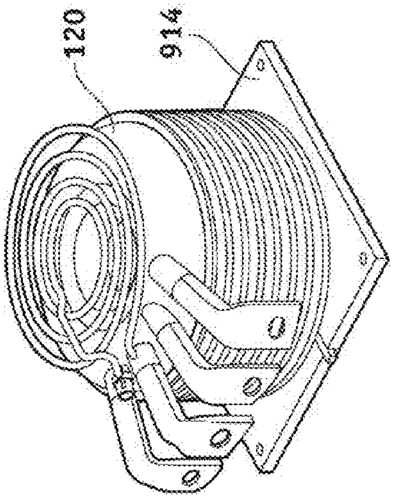
Figure 9F:
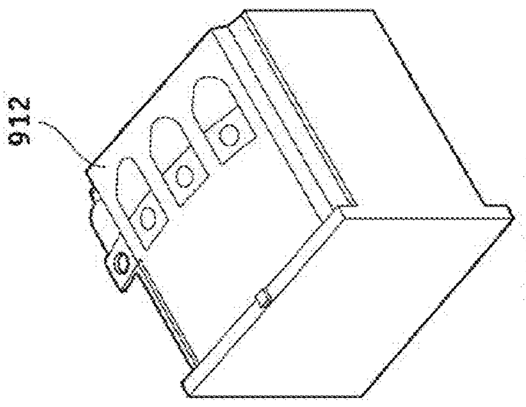

The active thermal management system may also comprise a circulating coolant system with cooling channels to circulate a coolant and remove heat. For example, referring now to FIG. 8, an exemplary active thermal management system comprises a fluid cooling system 800 including a cooling channel 810, a coolant 812, a heat exchanger 814, and a source 816. The source 816 delivers the relatively cool coolant 812 to the cooling channel 810, which is disposed in thermal communication with the inductor 120 such that heat from the inductor 120 is transferred directly or indirectly to the coolant 812. The cooling channel 810 may place the coolant 812 in direct or indirect thermal contact with the heat source, such as the inductor 120. For example, heat may be transferred through a wall of the cooling channel 810 to the coolant 812 (indirect thermal contact), or the coolant 812 may be applied directly to the heat source (direct thermal contact), such as by immersing the heat source in the coolant 812 within the cooling channel 810. The heated coolant 812 travels to the heat exchanger 814, which removes the heat from the coolant 812. The coolant 812 may then be returned via return pipe 818 to the source 816 for recirculation. Alternatively, the coolant may be discarded, such as for a system using sea water as a coolant.

The coolant 812 absorbs heat from a heat source, such as the inductor 120. The coolant 812 comprises any appropriate coolant, such as a gas, liquid, or suspended solid. For example, the coolant 812 may comprise a conventional coolant, such as water, a colligative agent such as conventional antifreeze, a refrigerant, or a heat transfer fluid. In the present embodiment, the coolant 812 comprises a water/glycerol solution or mixture. In alternative embodiments, such as those in which the coolant 812 directly contacts the heat source, the coolant 812 may comprise a non-conducting liquid, transformer oil, mineral oil, colligative agent, halo-carbon, fluorocarbon, chlorocarbon, fluorochlorocarbon, deionized water/alcohol mixture, or mixture of non-conducting liquids. Various aspects of the cooling system 810 may be adapted according to the coolant 812. For example, if the coolant is de-ionized water, small holes in the coating on the magnet wire may allow slow leakage of ions into the de-ionized water, resulting in an electrically conductive coolant, which may short circuit the system. Thus, if de-ionized water is used as the coolant 812, then the wire coating should be selected or adapted to prevent ion transport.

The source 816 provides the coolant 812 via the cooling channel 810. The source 816 comprises any appropriate source of coolant 812, such as a water pipe and/or reservoir, a pump, a compressor, and the like. In the present embodiment, the source 816 comprises a conventional pump for circulating the coolant 812 through the cooling channel 810 and the heat exchanger 814. If appropriate, the source 816 pressurizes the coolant 812, for example for use in conjunction with a gas coolant, such as a fluorocarbon or a chlorofluorocarbon. The source 816 may comprise, however, any appropriate source for providing coolant to the cooling channel.

The heat exchanger 814 removes heat from the coolant 812. The heat exchanger 814 comprises any system for removing heat from the coolant 812, such as a conventional heat sink, mechanical heat exchanger, fan, and/or a secondary cooling system. In the present embodiment, the heat exchanger 814 comprises a conventional heat exchanger comprising one or more channels exposed to a cooler environment. In another embodiment, the heat exchanger 814 may be omitted, for example by discarding the heated coolant 812.

The cooling channel 810 conducts the coolant 812 to the area to be cooled, such as to the inductor 120. For example, the cooling channel 810 may comprise one or more tubes or other hollow members connected to the source 816 and the heat exchanger 814 for circulating the coolant 812. The cooling channel 810 may cover or contact as much of the area to be cooled as is practical to remove heat from a large portion of the surface area. Alternatively, the cooling channel 810 may cover a limited area. In various embodiments, the cooling channel may cool one or more sides of the inductor 120, such as the outer surface, inner surface, and/or one or both ends of the inductor 120. The cooling channel 810 conducts the coolant 812 to the inductor 120 or other heat source. The volume or configuration of the cooling channel 810 and the delivery rate of the source 816 may be adjusted according to the heat removal requirements of the system, a desired time for reaching thermal equilibrium, and/or other relevant factors.

The cooling channel 810 may also conduct heat from the inductor 120 to the coolant 812. For example, the cooling channel 810 may comprise a material having a high thermal transfer rate for transferring heat to the coolant 812. In various embodiments, the cooling channel 810 may comprise tubing including copper, aluminum, stainless steel, alloys, thermally conductive plastic, or other suitable material. The material may be selected for other properties as well, such as electromagnetic shielding effects to reduce the electromagnetic emissions of the inductor 120. The cooling channel 810 may cover or contact as much of the inductor 120 as is practical to remove heat from a large portion of the inductor's 120 surface area. Alternatively, the cooling channel 810 may cover a reduced portion of the inductor's 120 surface. In another embodiment, the cooling channel 810 contains at least a portion of the inductor 120 or other heat source such that the heat source directly contacts the coolant 812.

For example, referring to FIGS. 8, 9A-F, 10, and 13, an exemplary exterior cooling channel 910 may comprise thermally conductive tubing, such as copper, aluminum, stainless steel, and/or other appropriate materials. In one embodiment, the exterior cooling channel 910 comprises one or more channels, a container, and/or a coil of thermally conductive tubing defining an approximately cylindrical cavity for receiving the inductor 120 and connected to the source 816 and the heat exchanger 814. The inductor 120 is disposed within the cylindrical cavity such that the exterior cooling channel 910 is disposed around the inductor 120. The exterior cooling channel 910 and other elements of the exterior cooling channel 910 may, however, be otherwise configured, such as in the form of a cast element having interior channels for conducting the coolant 812 and configured to cover one or more surface areas of the inductor 120.

An inner surface 1052 of the exterior cooling channel 910 thermally contacts the outer surface 1020 of the inductor 120 to facilitate heat transfer to the coolant 812. Thus, the exterior cooling channel 910 is disposed around the inductor 120, and substantially, thermally, and/or proximally contacts the outer surface 1020 of the inductor 120. The coils may make substantially constant contact with each other as the coils wind around the inductor 120 to optimize the coverage of the cooling channel 810 over the inductor 120.

One or more cooling channels 810 may also be adapted for various surfaces. For example, the cooling channel 810 may also comprise end cooling channels 916, 918 such as concentric coils of thermally conductive tubing, to cover the axial ends of the inductor 120. The end cooling channels 916, 918 may substantially, thermally, and/or proximally contact the first axial end 1040 and second axial end 1030 of the inductor 120. Alternatively, one or more axial ends of the inductor 120 may be cooled with other systems. For example, an end of the inductor 120 may be attached to a mounting plate 914 or bracket comprising a high thermal transfer rate material.

In addition, an interior cooling channel 1060 may be disposed in thermal contact with the inner 1010 surface of the toroidal inductor 120. For example, the interior cooling channel 1060 may comprise coiled thermally conductive tubing, one or more channels, or a container. The exterior surface 1064 of the interior cooling channel 1060 may substantially, thermally, and/or proximally contact the interior surface 1010 of the inductor 120. In the present embodiment, the interior cooling channel 1060 comprises a cylindrical coil 1062 of thermally conductive tubing that may be disposed within the central hole in the inductor 120. The various cooling channels may be coupled to the source 816 and/or the heat exchanger 814 in parallel and/or in series, or may be coupled independently to other sources and/or heat exchangers. In another example, combinations of cooling systems are used, such as combinations of air and liquid cooling systems.

The active thermal management system and/or the electrical system 100 may comprise additional elements or features according to the environment or application of the electrical system 100. For example, the cooling channel 810 and/or inductor 120 may be mounted on a mounting plate 914 or bracket comprising a high thermal transfer rate material. In the present embodiment, the reduced size of the inductor 120 compared to conventional inductors having similar performance characteristics creates a lower thermal mass, and the heat removal increases the performance of the inductor 120 and facilitates the use of a smaller inductor 120. In one embodiment, the inductor 120 and the cooling channel 810 may be sealed within a package, installed in a closed space, or even submerged. The inductor 120 may be configured to meet any relevant requirements, such as those of NEMA, for example to meet the Type 4, 4X, 6, or 6P enclosure standards or other relevant criteria.

The electrical system 100 may also employ additional materials for improving the thermal transfer away from the various components. For example, referring again to FIG. 6, a thermally conductive potting compound may be applied to the inductor 120 or other components, such as to increase the thermal transfer efficiency from the windings 212 and core 210 to the heat sink 610. A potting compound about the inductor 120 may to hold the heat sink 610 or housing in close proximity to the inductor 120 and increase thermal conductivity from the winding 212 surface to heat dissipating surfaces of the heat sink 610.

In addition, referring again to FIGS. 9A-F, the cooling channel 810 may be disposed within a high thermal transfer rate potting compound 912 to facilitate additional heat transfer away from the inductor 120, while providing electrical isolation. For example, the thermally conductive potting compound 912 may partially or fully encapsulate the inductor 120 or other electromagnetic component and seal it sufficiently to pass the NEMA 4 submersion test described in UL 50 for outdoor use. This allows the unit to stand alone, for example on the outside of a system cabinet. Consequently, the component is suitable for use in NEMA 4 outdoor system applications. The inductor 120 resists shorting due to the floating or ungrounded core of the toroid construction. In addition, outdoor models may be configured for the NEMA 4 submersion test in UL 50, for example by vertically mounting the inductor 120 with non-metallic machined parts.

The potting compound 912 may be selected according to any appropriate characteristic. For example, the potting compound 912 may be selected for a high thermal transfer coefficient. In addition, the potting compound 912 may be selected for resistance to fissure in response to a large internal temperature change of the inductor 120, such as greater than about 50, 100, or 150 degrees Centigrade. The potting compound 912 may also be selected for flexibility, for example to inhibit fissure with temperature variations, such as greater than 100 degrees Centigrade, in the potting compound 912. The potting compound 912 may also be selected for low thermal impedance between the inductor 120 and heat dissipation elements, sealing characteristics to seal the inductor assembly from the environment such that a unit can conform to various outdoor functions, such as exposure to water and salts, and mechanical integrity for holding the heat dissipating elements and inductor 120 together as a single module at high operating temperatures, such as up to about 150 or 200 degrees Centigrade.

In one embodiment, an electrical system 100 including a fluid cooling system 800 may include cooling channels that are over 100 degrees Centigrade cooler than the surface temperature of the magnet wire on the toroid core 210. The two structures may be closer than about one-tenth of an inch from each other. The potting compound 912 may thus be selected to perform reliably and efficiently under such conditions or other relevant conditions. Possible potting materials may include Conathane® (Cytec Industries, West Peterson, N.J.), such as Conathane EN-2551, 2553, 2552, 2550, 2534, 2523, 2521, and EN 7-24; Insulcase® (ITW Insulcast, Roseland, N.J.), such as Insulcast 333; Stycast® (Emerson and Cuming, Billerica, Mass.), such as Stycast 281; and epoxy varnish potting compound. Potting material may be mixed with silica sand or aluminum oxide, such as at about thirty to seventy percent, for example about forty-five percent silica sand or aluminum oxide by volume; to create a potting compound with lower thermal impedance.

In operation, an electrical system 100 supplies power to the load 124 by generating power via the source 114. The power signal is provided to the switching system 116, for example to regulate the magnitude of the power signal provided to the load 124. The switching system 116 or other sources may, however, introduce harmonics or other noise into the power signal, which may damage or disrupt the load or cause electromagnetic interference (EMI). The filter circuits 112A, 112B filter unwanted components from the power signal, such as harmonics and noise. The power signal is provided to the inductor 120, which establishes a current in the winding 212.

In the present embodiment, the core 210 exhibits low core losses in response to high frequencies as compared to silicon iron steel lamination. Consequently, the inductor 120 generates less heat in response to the harmonics and other higher frequency noise in the power signal. In addition, the exposed surface of the core 210 and of the winding 212 facilitates a lowering of the inductor 120 to air thermal resistance, thus increasing heat dissipation and increasing efficiency, especially in conjunction with the cooling system 118, such as an air and/or liquid cooling system. The low losses of the core 210 material reduce the overall power requirements of the inductor 120, thus reducing the necessary copper density for the winding 212. Moreover, because the inductor 120 accommodates higher frequencies without overheating and accommodates higher currents without saturating, a smaller core 210 reduces heat generation and/or to avoids saturation. The addition of the cooling system 118 further reduces the effects of heat. Consequently, the inductor 120 is relatively smaller and lighter while achieving the same or better performance.

Various aspects of the present invention may be illustrated in conjunction with the following examples. The examples are not limiting, but are provided to exemplify possible implementations of electrical systems according to various aspects of the present invention.

EXAMPLE I

Referring to FIGS. 10-13, an inverter/converter system according to various aspects of the present invention may be adapted to operate in conjunction with a poly-phase high voltage power line. For example, the inverter/converter system may comprise a three-core inductor system operable in combination with a poly-phase high voltage power line. The system has an electrical input connection 1101 and an electrical output connection 1102.

The cooling system 118 about a single phase of the electrical inverter/converter system includes the cooling channels 1201 to form an inner diameter surface 1301, outer diameter surface 1302, top cover 1303, and bottom cover 1304 about a wound inductor. The potting material 1305 couples the cooling system 1200 to the wound inductor. The cooling system 118 may comprise one or more cooling channels 1201 surrounding each inductor 1202. The cooling system 118 cools one or more portions of an annular inductor 120, such as the outer surface 1020, inner surface 1010, and/or one or both of the axial ends 1030, 1040. Coolant runs in through one or more inlet cooling lines 1104, circulates about the inductor 120, and runs out through one or more outlet cooling lines 1103. For a three-core system, three parallel cooling systems and/or cooling channels 810 may be deployed. Multiple isolated cooling systems may also be utilized. Coolant may be distributed into the inlet cooling lines via a coolant inlet manifold 1105 and collected after cooling the core with a coolant outlet manifold 1106.

The cooling channels 1201 may be potted into a closed box 1203 with a potting compound. A single phase assembly mounting plate 1204 may provide a base for the box, and several single phase assembly mounting plates may be attached to a three-phase assembly mounting plate 1205 of the electrical inverter/converter system 1100.

EXAMPLE II

A single cooling channel 810 may be adapted to simultaneously cool multiple cores. Referring now to FIG. 14, a series of six cores 1402 of an inductor/converter system 1400 are aligned along a single axis, where a single axis penetrates through a hollow geometric center of each core 1402. The hollow geometric center may be filled with a cooling line and/or a potting material. While six cores 1402 are illustrated, any appropriate number of cores 1402 may be accommodated. The cooling system 118 cools the cores 1402. A single cooling channel 1401 may run from an inlet 1403, through the center 1404 of each of the cores 1402, and return through an outlet 1408. The single cooling channel 1401 may be coupled with another or multiple other cooling lines 1405 that operate similarly. The cooling system 118 may be contained in a container 1406, such as a rectangular box, which may be filled with a potting material 1407.

The single cooling channel 1401 may comprise an electrical/cooling conductor. In the electrical/cooling conductor, a metal tube carries both the electrical current and the cooling fluid. For example, a metal, such as copper, aluminum, or stainless steel, single cooling channel 1401 may transfer cooling fluid on the inside and carry current and voltage through the electrically conductive conductor. Thus, the metal tube acts as an electrical conductor with current and voltage running along the outer surface of the metal tube creating resistance heat. At the same time, the conductor portion of the metal acts as a containment for the cooling liquid, allowing the cooling liquid to continually contact the hot inner surface of the metal tube. This maximizes the surface area of the cooling fluid with the hot element of the conductor, thereby minimizing thermal impedance in the cooling system. Such a configuration may be implemented using a single core or multiple cores.

EXAMPLE III

In another example, multiple inductors, such as substantially circular inductors or toroidal inductors, are individually and independently mounted. In the case of circular inductors, each circular inductor has its own axis of symmetry through the center of the toroid. Independently mounted circular inductors optionally each have separate axes. Similarly, substantially circular inductors and toroidal conductors each have an independent axis, though not necessarily an axis of symmetry. Separately mounted inductors having freedom of position allows placement of multiple inductors in geometries where traditional multiple inductors will not ordinarily fit.

For example, three inductors may be used with a long distance poly-phase high power electrical line. Individual mounting of three inductors associated with the three-phase high power electrical lines allows the system to use a combination of individual and separately mounted single phase toroids, which are mountable anywhere inside a system cabinet or enclosure to further improve efficiency and reduce airflow restrictions. This is made possible by each of the inductors of a poly-phase filter having isolated magnetic paths. This is an advantage over conventional configurations where air cannot easily flow through the center, around the sharp edges, and over the larger bulk of traditional multiphase systems. Conventional poly-phase silicon/iron lamination filter inductors have a single common magnetic path that inhibits separately packaging each of the poly-phase elements.

EXAMPLE IV

Referring now to FIGS. 15A-B, another example of a cooling system/wound core configuration 1500 includes a cooling system surrounding or sandwiching a wound core 1202 having an electrical in line 1101 and an electrical out line 1102. FIG. 15A illustrates the cooling system around the wound core and for ease of presentation and explanation, while FIG. 15B illustrates an exploded view of the cooling system about the wound core, such as the system might appear during manufacture. In this example, the cooling system comprises at least two parts, such as multiple coolant containment parts or a bottom section of a cooling jacket 1501 and a top section of a cooling jacket 1502. The two parts come together to surround or circumferentially surround the wound core 1202 during use. The top and bottom halves join each other along an axis coming down onto the toroid shape of the wound core 1202, referred to as a z-axis. However, the pieces making up the cooling system are optionally assembled in any orientation, such as along x-axis and/or y-axis, referring to the axis planes of the toroid.

Further, the top and bottom sections of a cooling jacket 1502, 1501 may be equal in size, or either piece could be from 1 to 99 percent of the mass of the sandwiched pair of pieces. For instance, the bottom piece may make up about 10, 25, 50, 75, or 90 percent of the combined cooling jacket 1502 assembly. Still further, the cooling jacket 1502 may be composed of multiple pieces, such as 3, 4, or more pieces, where the center pieces are rings sandwiched by the top and bottom section of the cooling jacket 1502, 1501.

Generally, any number of cooling pieces can come together along any combination of axes to form a jacket cooling the wound core 1202. Each section of the cooling jacket may contain its own coolant inlets and outlets. The bottom cooling jacket 1501 contains a coolant inlet 1503 and a coolant outlet 1504 and the top cooling jacket 1502 contains a second coolant inlet 1505 and coolant outlet 1506. A center hollow post 1507 in each of the top and bottom sections of the cooling jacket 1502, 1501 aids in extracting heat from the inner diameter of the core 1202. The cooling jackets 1501, 1502 may be seated to the wound core 1202 with use of a potting material. The potting material may be in liquid form during manufacturing and may be poured or injected around and about the cooling system and core 1202, which are both substantially contained in an enclosure. The liquid fills substantially all of the remaining area inside of the enclosure, forcing out air gaps that reduce thermal transfer efficiency. The potting material may form a solid material after setting.

In another embodiment, an inductor is in direct contact with a coolant. For example, an annular, toroidal, or substantially circular shaped inductor is at least partially immersed in a coolant, where the coolant is in intimate and direct thermal contact with a magnet wire, windings, or winding coating about a core of the inductor. The inductor may be fully immersed or sunk in the coolant. The coolant may be in direct contact with the inductor, wire, or windings about the core. In a second case, the coolant is within one-quarter inch of the inductor, wire, or windings with a thermal transfer material indirectly thermally connecting the inductor to the coolant. In the first case where the coolant directly contacts the magnet wire or a coating on the magnet wire, the coolant may be substantially non-conducting. For example, an annular shaped inductor may be fully immersed in an electrically insulating coolant that is in intimate thermal contact with the magnet wire heat of the toroid surface area.

EXAMPLE V

Referring now to FIG. 16, an examplary inductor cooling system 1600 cools an inductor 1601 in a container 1602. The container may be enclosed and contain a coolant 1604. The coolant may be in direct contact with the inductor 1601. The container 1602 may include mounting pads 1603, and the inductor 1601 may also be equipped with feet 1605 that allow for coolant 1604 contact with a bottom side of the inductor 1601 to further facilitate heat transfer from the inductor to the coolant 1604.

Heat may be removed from the coolant via a heat exchanger. In the present embodiment, the coolant 1604 flows through an exit path 1606, through a heat exchanger 1607, and is returned to the container 1602 via a return path 1609. A fan 1608 may remove heat from the heat exchanger. A pump 1610 may move the coolant 1604 through the circulating path. Power in and power out connections 1611, 1612 provide power to the inductor 1602. Electrical insulating connections 1613 provide electrical power interfaces with the container 1602.

EXAMPLE VI

Referring now to FIG. 17, an alternative cooling system 118 may place the inductor 1601 in direct contact with coolant. In this example, the container 1602 containing the inductor 1601 and holding the coolant 1604 is configured with heat sink fins. In this example, the container includes external heat sink fins 1701 connected to an outer surface of the container 1602 for heat transfer to the environment, such as to air. Additionally, this example uses internal heat sink fins 1702 attached to an inner surface of the container 1602, where the internal heat sink fins 1702 are in direct contact with the coolant 1604. The coolant facilitates heat transfer from the inductor 1601 and the internal heat sink fins 1702 facilitate heat transfer from the coolant to the container 1602 and/or external heat sink fins 1701.

EXAMPLE VII

The inductor 120 may be mounted to facilitate coolant flow around the inductor 120. For example, the electrical system 100 may include a mounting system adapted to permit coolant flow around the exterior, over the axial ends, and within the interior of the inductor 120. In one embodiment, referring now to FIGS. 18A-D, an exemplary inductor 1601 mounting system in the container 1602 facilitates coolant 1604 movement about an entire outer surface of the inductor 1601. The mounting system includes at least one mount, such as a first inductor mount 1801, that firmly holds the inductor 1601 in place, minimizes movement of the inductor 1601 during use, and further holds the inductor 1601 away from the inner surface of the container 1602. By holding the inductor away from the inner surface of the container, a gap is created facilitating coolant flow.

In the present example, the first inductor mount 1801 is generally cylindrical. The cylinder fits into the central opening of the generally annular inductor 1601 and holds the inductor in place, such as by bolting the mount to the container. The first inductor mount 1801 may extend outside an outer plane formed by the top or bottom of the inductor. The extension provides room for the coolant 1604 to flow above and/or below the inductor 1601 when the mount is on the upper or lower portion of the inductor 1601, respectively.

Figure 18A:
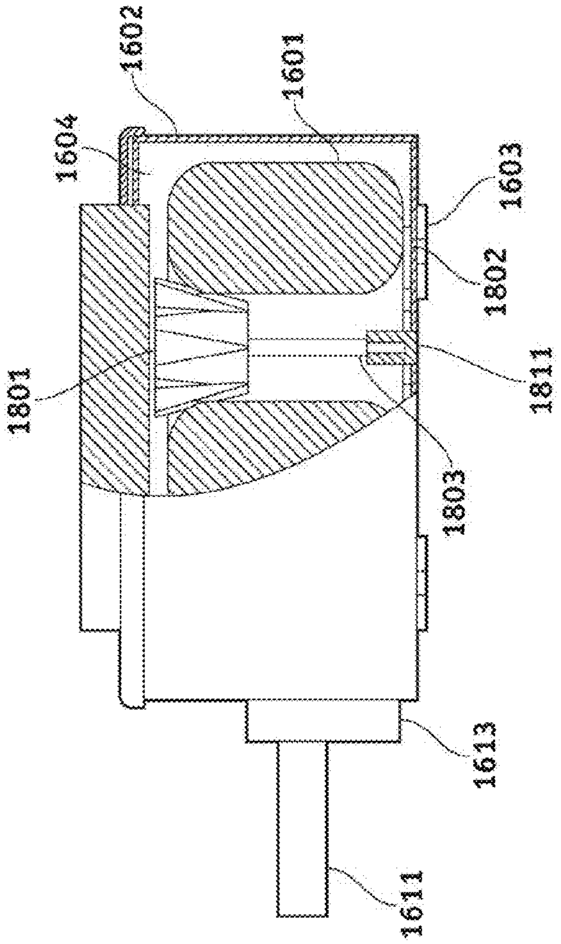
Figure 18C:
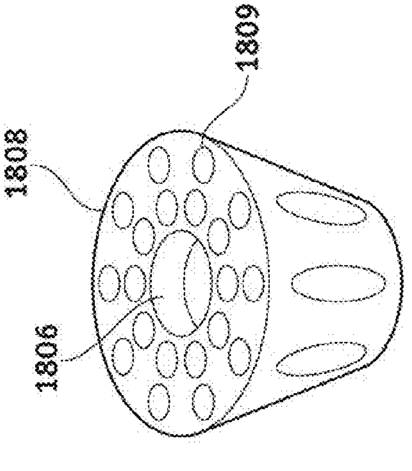
Figure 18B:
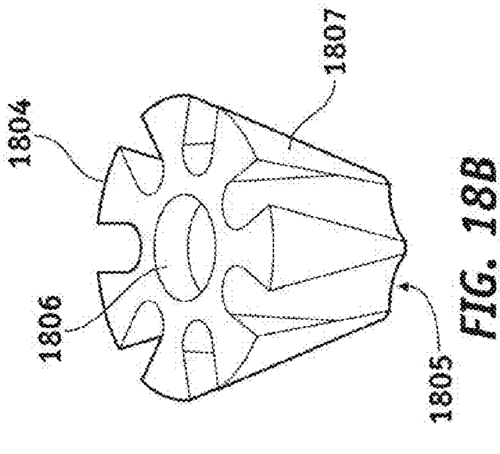
Figure 18D:
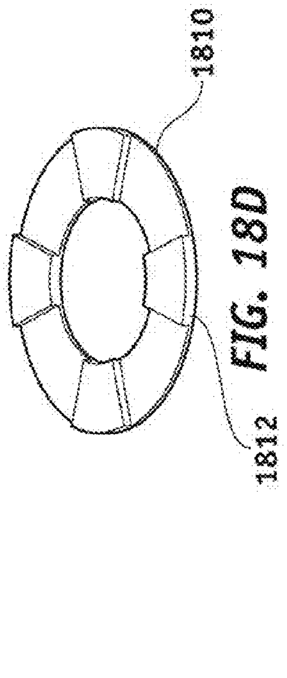

In another example, two inductor mounts are used. Referring to FIG. 18A, a conductor mount 1804 may be mounted with a mounting bolt 1803 through a spacer 1812 (FIG. 18D) to the container 1602, where the container is configured with a threaded standoff 1811. The first inductor mount 1801 connects to a second inductor mount 1802 with a mounting bolt 1803. In this example, the first inductor mount 1801 is tapered to provide a tight fit with the rounded edges of the central opening of the inductor 1601 when tightened into position using the mounting bolt 1803. In this example; the mounting bolt 1803 threads into the second inductor mount 1802, which is illustrated with an optional mounting standoff with threads. In this example, the second inductor mount 1802 is a spacer that creates a bottom gap below the inductor 1601 to facilitate heat exchange from the bottom of the inductor with the coolant 1604. Optionally, the mounting bolt mounts to the container 1602, which is optionally configured with built in or molded feet 1605 to create a coolant gap and/or is optionally configured with a mounting standoff or opening for receiving the mounting bolt 1803.

The two inductor mounts 1801, 1802 may comprise non-metallic material that resists deformation with temperature to temperatures of about 150, 175, or 200 degrees centigrade. The inductor mounts may include holes or passages for fluid flow through the inductor mounts, or the holes may be omitted.

The mounting system may promote coolant 1604 contact with the inductor 1601 and allows room for coolant 1604 flow about the inductor 1601. In one instance, the cooling system is passive. In another instance, the cooling system uses a circulating coolant, such as in conjunction with a circulating pump 1610 that is mounted internal or external to the container 1602. For instance, the use of a mounting bolt 1803 allows for maximum internal coolant 1604 volume for heat exchange capacity, does not touch the inductor allowing for coolant contact with the inductor 1601, and allows for a simple assembly process by bolting the first inductor mount 1801 to the threaded standoff 1811 of the second inductor mount 1802.

The inductor mounts 1801, 1802 may be configured in any suitable manner. For example, the inductor mount 1804 may include cavities to facilitate coolant flow around and/or through the mount 1804, such as grooves 1805 and/or a slot 1806. The grooves 1805 and slot 1806 of the mount allow coolant 1604 to flow through the inner compartment of the container 1602 and particularly allow coolant 1604 to flow through the inside diameter of the annular inductor 1601. The tapered edge 1807 of the mount 1804 in combination with the mounting bolt 1803 results in a secure mounting of the inductor 1601 in the container 1602. In an alternative embodiment, an inductor mount 1808 may contain one or more holes 1809 to facilitate coolant flow in the container 1602. The mount may also comprise a spacer 1812 (FIG. 18D), which may include cutouts 1810 to facilitate coolant flow.

EXAMPLE VIII

Various aspects of the present invention may also be adapted for poly-phase systems. Multiple inductors may be incorporated into a poly-phase system and connected to one or more shared or dedicated sources 816, heat exchangers 814, and the like. For example, referring now to FIG. 19, a series of containers 1602 containing a series of inductors 1601 are configured together with one or more cooling systems. The illustrated multi-container system may be used in conjunction with a poly-phase power system.

The particular implementations shown and described are illustrative of the invention and its best mode and are not intended to otherwise limit the scope of the present invention in any way. Indeed, for the sake of brevity, conventional manufacturing, connection, preparation, and other functional aspects of the system are not described in detail. Furthermore, the connecting lines shown in the various figures are intended to represent exemplary functional relationships and/or physical couplings between the various elements. Many alternative or additional functional relationships or physical connections are typically present in a complete system but are not integral to the invention described.

In the foregoing description, the invention has been described with reference to specific exemplary embodiments; however, various modifications and changes may be made without departing from the scope of the present invention as set forth. The description and figures are to be regarded in an illustrative manner, rather than a restrictive one and all such modifications are intended to be included within the scope of the present invention. Accordingly, the scope of the invention should be determined by the generic embodiments described and their legal equivalents rather than by merely the specific examples described above. For example, the steps recited in any method or process embodiment are optionally executed in any order and are not limited to the explicit order presented in the specific examples. Additionally, the components and/or elements recited in any apparatus embodiment are optionally assembled or otherwise operationally configured in a variety of permutations to produce substantially the same result as the present invention and are accordingly not limited to the specific configuration recited in the specific examples.

Benefits, other advantages, and solutions to problems have been described above with regard to particular embodiments; however, any benefit, advantage, solution to problems, or any element that causes any particular benefit, advantage or solution to occur or to become more pronounced are not to be construed as critical, required, or essential features or components.

The terms "comprises", "comprising", "include", "including", or any variation thereof, are intended to reference a non-exclusive inclusion, such that a process, method, article, composition, or apparatus that includes a list of elements does not include only those elements recited, but also includes other elements not expressly listed or inherent to such process, system, method, article, composition, or apparatus. Other combinations and/or modifications of the above-described structures, arrangements, applications, proportions, elements, materials, or components used in the practice of the present invention, in addition to those not specifically recited, are readily varied or otherwise particularly adapted to specific environments, manufacturing specifications, design parameters, or other operating requirements without departing from the general principles of the same.

The present invention has been described above with reference to exemplary embodiments. Changes and modifications may be made to the exemplary embodiments, however, without departing from the scope of the present invention.

The invention claimed is:

1. An apparatus for cooling an inverter/converter system, comprising:

an inductor, comprising: an inner face, an outer face, a first side, a second side, and a substantially annular core;

a plurality of coolant containment parts having an outer surface and an inner surface, wherein said plurality of coolant containment parts hold a non-conductive coolant within one-quarter inch of said inductor during use;

a first inductor mount, said first inductor mount minimizing shaking of said inductor during use, said first mount extending, from said inductor, beyond a plane formed by said first side of said inductor yielding room for the coolant during use; and a second inductor mount, said second mount extending beyond a plane formed by said second side of said inductor yielding room for the coolant during use, wherein said second inductor mount comprises a tapered outer surface contacting a rounded edge of said inner face of said inductor.

2. The apparatus of claim 1, wherein the coolant comprises a halocarbon.

3. The apparatus of claim 1, further comprising first heat sink fins connected to said outer surface of at least one of said coolant containment parts.

4. The apparatus of claim 3, further comprising second heat sink fins connected to said inner surface of said coolant containment parts, wherein said second heat sink fins directly contact the coolant during use.

5. The apparatus of claim 1, further comprising a mounting system holding said inductor, said mounting system preventing direct contact of said outer face of said inductor, said first side of said inductor, and said second side of said inductor with said inner surface of said containment parts yielding a gap for the coolant.

6. The apparatus of claim 1, wherein said second inductor mount comprises at least one groove, for flow of the coolant, on said tapered outer surface.

7. The apparatus of claim 1, wherein at least one of said first inductor mount and said second inductor mount comprises at least one hole for flow of the coolant.

8. The apparatus of claim 1, further comprising a tapered inductor mount contacting a rounded edge of said inner surface of said inductor, wherein said inductor mount comprises either: a hole for flow of the coolant or a groove for flow of the coolant.

9. The apparatus of claim 1, further comprising a mount minimizing movement of said inductor, wherein said mount comprises either: a hole for flow of the coolant or a groove for flow of the coolant.

10. The apparatus of claim 9, wherein said inductor exhibits a permeability of less than thirteen delta Gauss per delta Oersted at a load of four hundred Oersteds.

11. The apparatus of claim 1, wherein said inductor comprises a magnetic field of less than five thousand gauss at two hundred Oersteds.

12. The apparatus of claim 1, wherein said inductor exhibits a permeability of less than about ten delta Gauss per delta Oersted at a load of four hundred Oersteds.

13. The apparatus of claim 1, wherein said inductor exhibits a substantially linear inductance from about −4400 B at −400 H to about 4400 B at 400 H, wherein said inductor exhibits a substantially linear flux density response to magnetizing forces over a range of −400 to 400 H.

14. The apparatus of claim 1, further comprising:

a source holding coolant during use, wherein the source delivers the coolant into the at least one coolant containment parts;

a heat exchanger removing heat from the coolant; and a return pipe connected to the heat exchanger, wherein the return pipe returns the coolant to the source.

15. A method for controlling an operating temperature of an electrical system, comprising:

providing a high current inductor comprising a substantially annular core; and delivering a coolant to the high current inductor through multiple coolant containment parts, wherein:

the coolant comprises an electrically non-conductive coolant; and the coolant containment parts hold the coolant within one-quarter inch of said inductor during use, wherein the inductor is mounted on a tapered inductor mount contacting a rounded edge of an inner surface of the inductor, wherein the inductor mount has defined therein at least one of a hole for flow of the coolant and a groove for flow of the coolant.

16. A method for controlling an operating temperature according to claim 15, wherein the coolant containment parts comprise heat sink fins connected to an outer surface of at least one of the containment parts.

17. A method for controlling an operating temperature according to claim 15, wherein the inductor comprises a magnetic field of less than five thousand gauss at two hundred Oersteds.

* * * * *